(12) United States Patent
Tseng et al.

(10) Patent No.: US 12,068,030 B2
(45) Date of Patent: Aug. 20, 2024

(54) CAM CELL, CAM DEVICE AND OPERATION METHOD THEREOF, AND METHOD FOR SEARCHING AND COMPARING DATA

(71) Applicant: MACRONIX INTERNATIONAL CO., LTD., Hsinchu (TW)

(72) Inventors: Po-Hao Tseng, Taichung (TW);
Feng-Min Lee, Hsinchu (TW);
Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 211 days.

(21) Appl. No.: 17/524,771

(22) Filed: Nov. 12, 2021

(65) Prior Publication Data

US 2023/0036141 A1    Feb. 2, 2023

Related U.S. Application Data

(60) Provisional application No. 63/223,551, filed on Jul. 20, 2021, provisional application No. 63/223,554, filed on Jul. 20, 2021.

(51) Int. Cl.
| | |
|---|---|
| *G11C 15/00* | (2006.01) |
| *G11C 15/04* | (2006.01) |
| *G11C 16/04* | (2006.01) |
| *G11C 16/08* | (2006.01) |
| *G11C 16/10* | (2006.01) |
| *G11C 16/24* | (2006.01) |
| *G11C 16/26* | (2006.01) |

(52) U.S. Cl.
CPC ........ *G11C 15/046* (2013.01); *G11C 16/0483* (2013.01); *G11C 16/08* (2013.01); *G11C 16/10* (2013.01); *G11C 16/24* (2013.01); *G11C 16/26* (2013.01)

(58) Field of Classification Search
CPC ... G11C 15/046; G11C 16/0483; G11C 16/08; G11C 16/10; G11C 16/24; G11C 16/26; G11C 13/0019; G11C 11/5628; G11C 11/5642
See application file for complete search history.

(56) References Cited

U.S. PATENT DOCUMENTS

| | | | |
|---|---|---|---|
| 6,256,216 B1 | 7/2001 | Lien | |
| 6,317,349 B1 * | 11/2001 | Wong | G11C 15/046 365/49.17 |
| 6,339,540 B1 | 1/2002 | Lavi | |

(Continued)

*Primary Examiner* — Uyen Smet
(74) *Attorney, Agent, or Firm* — McClure, Qualey & Rodack, LLP

(57) ABSTRACT

The application provides a content addressable memory (CAM) cell, a CAM memory device and an operation method thereof, and a method for searching and comparing data. The CAM cell includes a first flash memory cell having a first terminal for receiving a first search voltage; and a second flash memory cell having a first terminal for receiving a second search voltage, a second terminal of the first flash memory cell electrically connected to a second terminal of the second flash memory cell, wherein the first flash memory cell and the second flash memory cell are serially connected; and a storage data of the CAM cell is based on a combination of a plurality of threshold voltages of the first flash memory cell and the second flash memory cell.

7 Claims, 15 Drawing Sheets

(56) References Cited

U.S. PATENT DOCUMENTS

| | | |
|---|---|---|
| 7,177,183 B2 | 2/2007 | Scheuerlein |
| 11,410,727 B1* | 8/2022 | Hoang ............... G11C 16/3404 |
| 2009/0190404 A1 | 7/2009 | Roohparvar |
| 2016/0172037 A1* | 6/2016 | Lee ....................... G11C 16/26 |
| | | 365/185.12 |

* cited by examiner

CAM CELL, CAM DEVICE AND OPERATION METHOD THEREOF, AND METHOD FOR SEARCHING AND COMPARING DATA

This application claims the benefit of U.S. provisional application Ser. No. 63/223,551, filed Jul. 20, 2021, and U.S. provisional application Ser. No. 63/223,554, filed Jul. 20, 2021, the subject matters of which are incorporated herein by references.

BACKGROUND OF THE INVENTION

Field of the Invention

The invention relates in general to a content addressable memory (CAM) cell, a CAM memory device and an operation method thereof, and a method for searching and comparing data, and more particularly to a CAM cell capable of implementing an in-memory searching (IMS) system, a CAM memory device and an operation method thereof, and a method for searching and comparing data.

Description of the Related Art

Along with the booming growth in big data and artificial intelligence (AI) hardware accelerator, data search and data comparison have become essential functions. The existing ternary content addressable memory (TCAM) can be configured to implement highly parallel searching. Conventional TCAM is normally formed by static random access memory (SRAM), and therefore has low memory density and requires high access power. Recently, a non-volatile memory array based on TCAM has been provided to save power consumption through dense memory density.

In comparison to the TCAM based on SRAM having 16 transistors (16T), recently a resistive random access memory (RRAM)-based TCAM having 2-transistor and 2-resistor (2T2R) structure has been provided to reduce cell area. Also, standby power consumption can be reduced through the non-volatile RRAM-based TCAM. However, since the RRAM has only a limited resistor ratio (R-ratio) and matching statuses and non-matching statuses are hardly distinguish, the RRAM is not suitable to perform parallel search on a large amount of data. In comparison to the 2T2R structure, the ferroelectric FET (FeFET)-based TCAM array can provide an even higher on-current/off-current ratio and a dense memory array. Since the on-current/off-current ratio of the FeFET device is not high enough and affects the matching accuracy, the FeFET device is not applicable to long word search design.

Besides, in the DNA genome analysis, DNA or RNA sequenced quantity is measured using next generation sequencing (NGS) technique. A genome is divided and sequenced as several data reads, which are then mapped to a reference genome (the mapping is referred as read mapping) to match and position the genome. Read mapping, which requires a large number of memories and is limited by the communication between the communication memory and the computing unit (CPU/GPU), has become the most time-consuming process in genome analysis.

Therefore, it has become a prominent task for the industries to provide a CAM device and an operation method thereof, and a method for searching and comparing data, which, when used in in-memory searching (IMS) system and genome analysis, are capable of increasing matching accuracy and applicable to long word search design.

SUMMARY OF THE INVENTION

According to one embodiment of the present invention, a CAM cell is provided. The CAM cell includes a first flash memory cell having a first terminal for receiving a first search voltage; and a second flash memory cell having a first terminal for receiving a second search voltage, a second terminal of the first flash memory cell electrically connected to a second terminal of the second flash memory cell, wherein the first flash memory cell and the second flash memory cell are serially connected; and a storage data of the CAM cell is based on a combination of a plurality of threshold voltages of the first flash memory cell and the second flash memory cell.

According to another embodiment of the present invention, a CAM device is provided. The CAM device includes a plurality of first CAM cell strings, a first word line driver, a plurality of first matching lines, a plurality of first sense amplifiers, and a decoder. The first CAM cell strings includes a plurality of first CAM cells, each of the first CAM cells includes a plurality of flash memory cells and a storage data of each of the first CAM cells is based on a combination of a plurality of threshold voltages of the flash memory cells of each of the first CAM cells. The first word line driver is configured to provide a plurality of first search voltages and a plurality of second search voltages to the first CAM cells. The first matching lines are coupled to the first CAM cells. The first sense amplifiers are coupled to the first matching line. The decoder is coupled to the first sense amplifiers. When the first search voltages and the second search voltages are applied on the first CAM cells, the first sense amplifiers sense a plurality of first matching currents on the first matching lines to generate a plurality of first sensing results. The decoder generates a first matched address according to the first sensing results, wherein the first matched address indicates addresses of the first CAM cells having a matched first search result.

According to an alternate embodiment of the present invention, an operation method of a CAM device is provided. The operation method includes: programing a plurality of CAM cells, wherein each of the CAM cells includes a plurality of flash memory cells, a storage data of each of the CAM cells is based on a combination of a plurality of threshold voltages of the flash memory cells of each of the CAM cells, and the CAM cells are coupled to a plurality of matching lines; applying a plurality of first search voltages and a plurality of second search voltages on the CAM cells; sensing a plurality of matching currents on the matching lines to generate a plurality of sensing results; and generating a matched address according to the sensing results, wherein the matched address indicates that a search result is individual addresses of the matched CAM cells.

According to another alternate embodiment of the present invention, a CAM device is provided. The CAM device includes a plurality of CAM cell strings, a word line decoder and driver, a plurality of matching lines, a plurality of sense counting circuits, and a decoder. Each of the CAM cell strings includes a plurality of CAM cells, each of the CAM cells includes a plurality of serial-coupled flash memory cells, and individual storage data of each of the CAM cell strings is related to a portion of a reference string data. The word line decoder and driver is configured to provide a plurality of search voltage to the CAM cells, wherein in a plurality of comparison rounds, the word line decoder and driver determines the search voltages applied on the CAM cells according to a data read. The matching lines are coupled to the CAM cells. The sense counting circuits are coupled to the matching lines. The decoder is coupled to the sense counting circuits. In the comparison rounds, when the search voltages are applied on the CAM cells, the sense counting circuits sense and count a plurality of matching currents on the matching lines to generate a plurality of counting results; and the decoder determines whether the data read matches the reference string data according to the counting results of the sense counting circuits.

According to further another alternate embodiment of the present invention, a method for searching and comparing data is provided. The method includes: programming a plurality of CAM cells, wherein each of the CAM cells includes a plurality of serial-coupled flash memory cells, individual storage data of each of the CAM cells string is related to a portion of a reference string data, and the CAM cells are coupled to a plurality of matching lines; applying a plurality of search voltage on the CAM cells, wherein in a plurality of comparison rounds, a data read is configured to determine the search voltages applied on the CAM cells; in the comparison rounds, sensing and counting a plurality of matching currents on the matching lines to generate a plurality of counting results; and determining whether the data read matches the reference string data according to the counting results.

The above and other aspects of the invention will become better understood with regard to the following detailed description of the preferred but non-limiting embodiment(s). The following description is made with reference to the accompanying drawings.

DETAILED DESCRIPTION OF THE INVENTION

Technical terms are used in the specification with reference to generally-known terminologies used in the technology field. For any terms described or defined in the specification, the descriptions and definitions in the specification shall prevail. Each embodiment of the present disclosure has one or more technical features. Given that each embodiment is implementable, a person ordinarily skilled in the art can selectively implement or combine some or all of the technical features of any embodiment of the present disclosure.

First Embodiment

Figure 1:
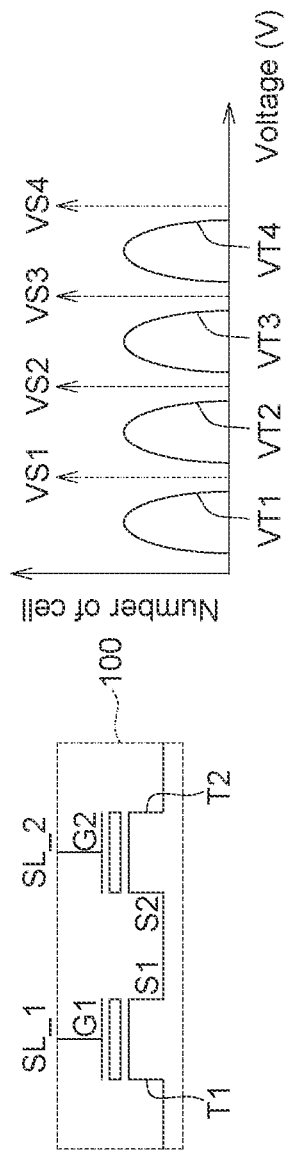
FIG. 1 is a schematic diagram of a CAM cell and its operation according to a first embodiment of the present application.

FIG. 1 is a schematic diagram of a CAM cells 100 and its operation according to a first embodiment of the present application. As indicated in FIG. 1A, the CAM cells 100 according to the first embodiment of the present application can be realized by but is not limited to a multi-level CAM (MLC) capable of storing 2 bits.

The CAM cells 100 includes two serial-coupled flash memory cells T1 and T2, wherein the flash memory cells can be realized but is not limited to floating gate memory cells, silicon-oxide-nitride-oxide-silicon (SONOS) memory cells, floating dot memory cells, ferroelectric FET (FeFET) memory cells.

The gate G1 of the flash memory cell T1 is configured to receive a first search voltage SL_1. The gate G2 of the flash memory cell T2 is configured to receive a second search voltage SL_2. The source S1 of the flash memory cell T1 is electrically connected to the source S2 of the flash memory cell T2.

Moreover, in the first embodiment of the present application, the threshold voltage of the flash memory cell T1 (also referred as first threshold voltage); the threshold voltage of the flash memory cell T2 (also referred as second threshold voltage), the first search voltage SL_1 and the second search voltage SL_2 can have different settings. In FIG. 1A, the settings of the first threshold voltage, the second threshold voltage, the first search voltage SL_1 and the second search voltage SL_2 can be obtained with reference to the following tables, and relevant details are omitted here:

| Storage data | 00 | 01 | 10 | 11 | XX (don't care) | Invalid data |
|---|---|---|---|---|---|---|
| First threshold voltage | VT1 | VT2 | VT3 | VT4 | VT1 | ≥VT4 |
| Second threshold voltage | VT4 | VT3 | VT2 | VT1 | VT1 | |

-continued

| Search data | 00 | 01 | 10 | 11 | Wildcard (WC) |
|---|---|---|---|---|---|
| First search voltage SL_1 | VS1 | VS2 | VS3 | VS4 | VS4 |
| Second search voltage SL_2 | VS4 | VS3 | VS2 | VS1 | VS4 |

In the first embodiment of the present application, when the storage data is a first predetermined storage data (00), the first threshold voltage is VT1 (also referred as a minimum threshold voltage value) and the second threshold voltage is VT4 (also referred as a maximum threshold voltage value); when the storage data is a second predetermined storage data (11), the first threshold voltage is the maximum threshold voltage value and the second threshold voltage is the minimum threshold voltage value; when the storage data is a third predetermined storage data (XX (don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the first embodiment of the present application, the storage data of the CAM cells 100 is based on a combination of the first threshold voltage and the second threshold voltage.

In the first embodiment of the present application, when the search data is a first predetermined search data (00), the first search voltage SL_1 is VS1 (also referred as a minimum search voltage value) and the second search voltage SL_2 is VS4 (also referred as a maximum search voltage value), wherein the search data represents data to be searched; when the search data is a second predetermined search data (11), the first search voltage SL_1 is the maximum search voltage value and the second search voltage SL_2 is the minimum search voltage value; when the search data is a third predetermined search data (WC), the first search voltage SL_1 and the second search voltage SL_2 both are the maximum search voltage value.

Therefore, during search, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is not turned on, and no matching current will be generated, indicating that the search result is "mismatch"; when the search data is a wildcard (WC), regardless of the value of the storage data, the flash memory cell T1 and the flash memory cell T2 both generate a matching current, indicating that the search result is "match"; when the storage data is XX (don't care), regardless of the value of the search data, the flash memory cell T1 and the flash memory cell T2 both generate a matching current, indicating that the search result is "match". For example, when the search data (00) matches the storage data (00), the flash memory cell T1 and the flash memory cell T2 both generate a matching current, indicating that the search result is "match"; when the search data (00) does not match the storage data (01), the flash memory cell T1 is turned off but the flash memory cell T2 is turned on, and no matching current will be generated, indicating that the search result is "mismatch". Therefore, the matching statuses of the search data and the storage data can be obtained with reference to the following table, and relevant details are omitted here:

| Search data | Storage data | | | | |
|---|---|---|---|---|---|
| | 00 | 01 | 10 | 11 | XX |
| 00 | match T1: ○ T2: ○ | mismatch T1: X T2: ○ | mismatch T1: X T2: ○ | mismatch T1: X T2: ○ | match T1: ○ T2: ○ |
| 01 | mismatch T1: ○ T2: X | match T1: ○ T2: ○ | | | |
| 10 | | | mismatch T1: ○ T2: X | match T1: ○ T2: ○ | |
| 11 | | | | mismatch T1: ○ T2: X | match T1: ○ T2: ○ |
| WC | match T1: ○ T2: ○ | match T1: ○ T2: ○ | match T1: ○ T2: ○ | | |

○: the flash memory cell is turned on,
X: the flash memory cell is not turned on In another embodiment, the search data will match the least similar storage data. That is, when the storage data is complementary to the search data, the search is regarded as "match". Details are disclosed below, and the settings of the first threshold voltage, the second threshold voltage, the first search voltage SL_1 and the second search voltage SL_2 can be obtained with reference to the following tables:

| | 00 | 01 | 10 | 11 |
|---|---|---|---|---|
| Storage data | | | | |
| First threshold voltage | VT4 | VT3 | VT2 | VT1 |
| Second threshold voltage | VT1 | VT2 | VT3 | VT4 |
| Search data | | | | |
| First search voltage SL_1 | VS1 | VS2 | VS3 | VS4 |
| Second search voltage SL_2 | VS4 | VS3 | VS2 | VS1 |

For example, when the first threshold voltage and the second threshold voltage respectively are VT1 and VT4, the storage data is regarded as 00, and the storage data (00) matches the least similar search data (11) (that is, the first search voltage SL_1 and the second search voltage SL_2 respectively are VS4 and VS1), such that the flash memory cell T1 and the flash memory cell T2 both are turned on and generate a matching current, indicating that the search result is "match"; if search comparison is performed on the search data (11) and the storage data (11) (that is, the first threshold voltage and the second threshold voltage respectively are VT4 and VT1), the flash memory cell T1 is turned on but the flash memory cell T2 is turned off, and no matching current will be generated, indicating that the search result is "mismatch"; if search comparison is performed on the search data (11) and the storage data (01) (that is, the first threshold voltage and the second threshold voltage respectively are VT2 and VT3), the flash memory cell T1 is turned on but the flash memory cell T2 is turned off, and no matching current will be generated, indicating that the search result is "mismatch". Therefore, the matching statuses of the search data and the storage data can be obtained with reference to the following table, and relevant details are omitted here:

| Search data | Storage data | | | |
|---|---|---|---|---|
| | 11 | 10 | 01 | 00 |
| 00 | match<br>T1: ○<br>T2: ○ | mismatch<br>T1: X<br>T2: ○ | mismatch<br>T1: X<br>T2: ○ | mismatch<br>T1: X<br>T2: ○ |
| 01 | mismatch<br>T1: ○<br>T2: X | match<br>T1: ○<br>T2: ○ | | |
| 10 | mismatch<br>T1: ○<br>T2: X | match<br>T1: ○<br>T2: ○ | | |
| 11 | | | mismatch<br>T1: ○<br>T2: X | match<br>T1: ○<br>T2: ○ |

In an alternate embodiment, the search data will match the least similar (complementary) storage data. Details are disclosed below, and the settings of the first threshold voltage, the second threshold voltage, the first search voltage SL_1 and the second search voltage SL_2 can be obtained with reference to the following tables:

| | 00 | 01 | 10 | 11 |
|---|---|---|---|---|
| Storage data | | | | |
| First threshold voltage | VT1 | VT2 | VT3 | VT4 |
| Second threshold voltage | VT4 | VT3 | VT2 | VT1 |
| Search data | | | | |
| First search voltage SL_1 | VS4 | VS3 | VS2 | VS1 |
| Second search voltage SL_2 | VS1 | VS2 | VS3 | VS4 |

For example, when the first search voltage SL_1 and the second search voltage SL_2 respectively are VS4 and VS1 (that is, the search data is 00), the search data (00) will match the least similar (complementary) storage data (11) (that is, the first threshold voltage and the second threshold voltage respectively are VT4 and VT1), such that the flash memory cell T1 and the flash memory cell T2 both are turned on and generate a matching current, indicating that the search result is "match"; if search comparison is performed on the search data (00) and the storage data (00) (that is, the first threshold voltage and the second threshold voltage respectively are VT1 and VT4), the flash memory cell T1 is turned on but the flash memory cell T2 is turned off, and no matching current will be generated, indicating that the search result is "mismatch"; if search comparison is performed on the search data (00) and the storage data (01) (that is, the first threshold voltage and the second threshold voltage respectively are VT2 and VT3), the flash memory cell T1 is turned on but the flash memory cell T2 is turned off, and no matching current will be generated, indicating that the search result is "mismatch". Therefore, the matching statuses of the search data and the storage data can be obtained with reference to the following table, and relevant details are omitted here:

| Search data | Storage data | | | |
|---|---|---|---|---|
| | 00 | 01 | 10 | 11 |
| 11 | match<br>T1: ○<br>T2: ○ | mismatch<br>T1: X<br>T2: ○ | mismatch<br>T1: X<br>T2: ○ | mismatch<br>T1: X<br>T2: ○ |
| 10 | mismatch<br>T1: ○<br>T2: X | match<br>T1: ○<br>T2: ○ | | |
| 01 | | mismatch<br>T1: ○<br>T2: X | match<br>T1: ○<br>T2: ○ | |
| 00 | | | mismatch<br>T1: ○<br>T2: X | match<br>T1: ○<br>T2: ○ |

Second Embodiment

Figure 2:
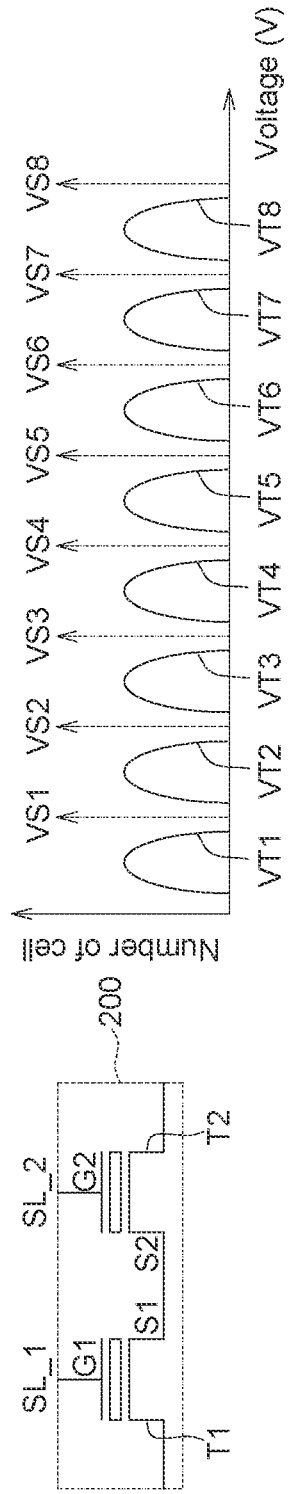
FIG. 2 is a schematic diagram of a CAM cell and its operation according to a second embodiment of the present application.

Referring to FIG. 2, a schematic diagram of a CAM cells 200 and its operation according to a second embodiment of the present application is shown. The CAM cells 200 can be realized by but is not limited to a triple-level CAM (TLC) capable of storing 3 bits.

In the second embodiment of the present application, the first threshold voltage, the second threshold voltage, the first search voltage SL_1 and the second search voltage SL_2 can have different settings. In FIG. 2, the settings of the first threshold voltage, the second threshold voltage, the first search voltage SL_1 and the second search voltage SL_2 can be obtained with reference to the following tables, and relevant details are omitted here:

| Storage data | First threshold voltage | Second threshold voltage |
|---|---|---|
| 000 | VT1 | VT8 |
| 001 | VT2 | VT7 |
| 010 | VT3 | VT6 |
| 011 | VT4 | VT5 |
| 100 | VT5 | VT4 |
| 101 | VT6 | VT3 |
| 110 | VT7 | VT2 |
| 111 | VT8 | VT1 |
| XXX (don't care) | VT1 | VT1 |
| Invalid data | | ≥VT8 |

| Search data | First search voltage SL_1 | Second search voltage SL_2 |
|---|---|---|
| 000 | VS1 | VS8 |
| 001 | VS2 | VS7 |
| 010 | VS3 | VS6 |
| 011 | VS4 | VS5 |
| 100 | VS5 | VS4 |
| 101 | VS6 | VS3 |
| 110 | VS7 | VS2 |
| 111 | VS8 | VS1 |
| Wildcard (WC) | VS8 | VS8 |

In the second embodiment of the present application, when the storage data is a first predetermined storage data (000), the first threshold voltage is VT1 (also referred as a minimum threshold voltage value) and the second threshold voltage is VT8 (also referred as a maximum threshold voltage value); when the storage data is a second predetermined storage data (111), the first threshold voltage is the maximum threshold voltage value and the second threshold voltage is the minimum threshold voltage value; when the storage data is a third predetermined storage data (XXX (don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the second embodiment of the present application, the storage data of the CAM cells 200 is based on a combination of the first threshold voltage and the second threshold voltage.

In the second embodiment of the present application, when the search data is a first predetermined search data (000), the first search voltage SL_1 is VS1 (also referred as a minimum search voltage value) and the second search voltage SL_2 is VS8 (also referred as a maximum search voltage value); when the search data is a second predetermined search data (111), the first search voltage SL_1 is the maximum search voltage value and the second search voltage SL_2 is the minimum search voltage value; when the search data is a third predetermined search data (WC), the first search voltage SL_1 and the second search voltage SL_2 both are the maximum search voltage value.

Therefore, during search, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is turned on, and no matching current will be generated, indicating that the search result is "mismatch"; when the search data is a wildcard (WC), regardless of the value of the storage data, the flash memory cell T1 and the flash memory cell T2 both generate a matching current, indicating that the search result is "match"; when the storage data is XX (don't care), regardless of the value of the search data, the flash memory cell T1 and the flash memory cell T2 both generate a matching current, indicating that the search result is "match". For example, when the search data (000) matches the storage data (000), the flash memory cell T1 and the flash memory cell T2 both generate a matching current, indicating that the search result is "match"; when the search data (000) does not match the storage data (001), the flash memory cell T1 is turned off but the flash memory cell T2 is turned on, and no matching current will be generated, indicating that the search result is "mismatch". Therefore, the matching statuses of the search data and the storage data can be obtained with reference to the following table, and relevant details are omitted here:

| Search data | Storage data | | | |
|---|---|---|---|---|
| | 000 | 001 | 010 | 011 |
| 000 | match<br>T1: ○<br>T2: ○ | mismatch<br>T1: X<br>T2: ○ | mismatch<br>T1: X<br>T2: ○ | mismatch<br>T1: X<br>T2: ○ |
| 001 | mismatch<br>T1: ○<br>T2: X | match<br>T1: ○<br>T2: ○ | | |
| 010 | | mismatch<br>T1: ○<br>T2: X | match<br>T1: ○<br>T2: ○ | |
| 011 | | | mismatch<br>T1: ○<br>T2: X | match<br>T1: ○<br>T2: ○ |
| 100 | | | | mismatch<br>T1: ○<br>T2: X |
| 101 | | | | |
| 110 | | | | |
| 111 | | | | |
| WC | match | match | match | match |

-continued

| | T1: ○<br>T2: ○ | T1: ○<br>T2: ○ | T1: ○<br>T2: ○ | T1: ○<br>T2: ○ | |
|---|---|---|---|---|---|
| Search data | Storage data | | | | |
| | 100 | 101 | 110 | 111 | XX |
| 000 | mismatch<br>T1: X<br>T2: ○ | mismatch<br>T1: X<br>T2: ○ | mismatch<br>T1: X<br>T2: ○ | mismatch<br>T1: X<br>T2: ○ | match<br>T1: ○<br>T2: ○ |
| 001 | | | | | |
| 010 | | | | | |
| 011 | | | | | |
| 100 | match<br>T1: ○<br>T2: ○ | | | | |
| 101 | mismatch<br>T1: ○<br>T2: X | match<br>T1: ○<br>T2: ○ | | | |
| 110 | | mismatch<br>T1: ○<br>T2: X | match<br>T1: ○<br>T2: ○ | | |
| 111 | | | mismatch<br>T1: ○<br>T2: X | match<br>T1: ○<br>T2: ○ | |
| WC | match<br>T1: ○<br>T2: ○ | match<br>T1: ○<br>T2: ○ | match<br>T1: ○<br>T2: ○ | | |

Third Embodiment

Figure 3:
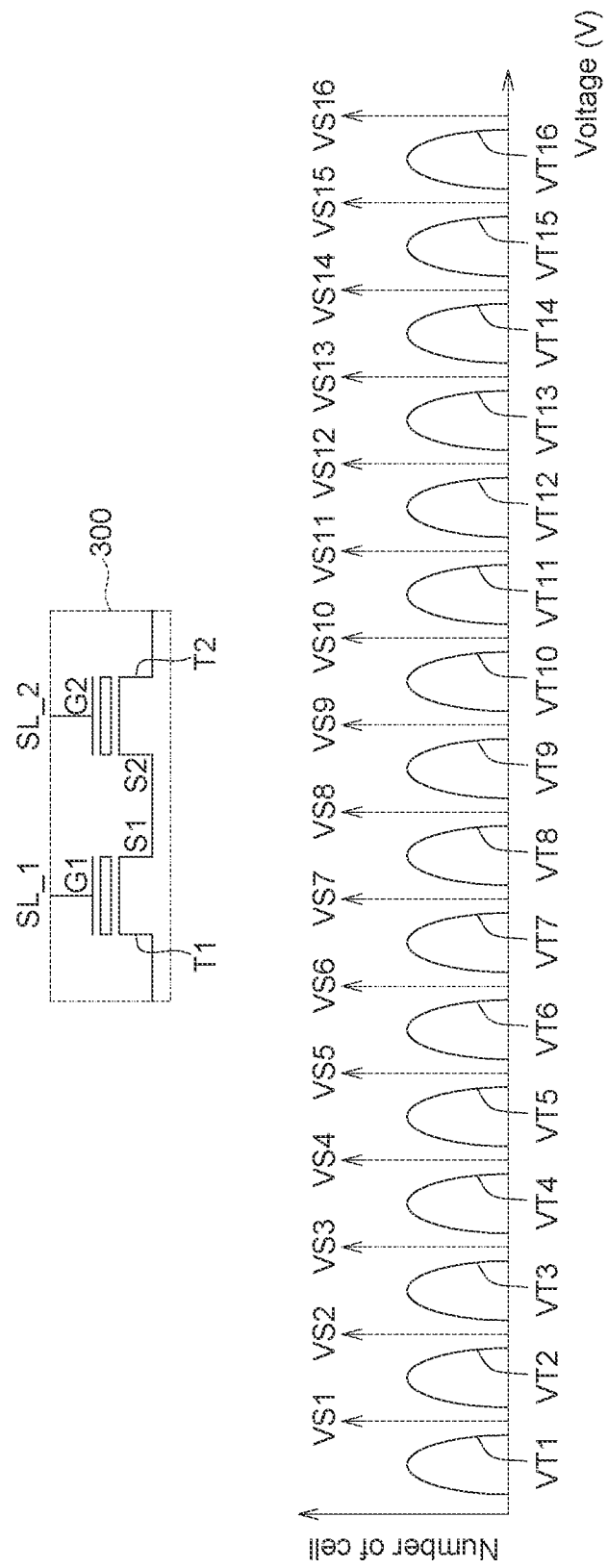
FIG. 3 is a schematic diagram of a CAM cell and its operation according to a third embodiment of the present application.

Referring to FIG. 3, a schematic diagram of a CAM cells 300 and its operation according to a third embodiment of the present application is shown. The CAM cells 300 can be realized by but is not limited to a quad-level CAM (QLC) capable of storing 4 bits.

In the third embodiment of the present application, the first threshold voltage, the second threshold voltage, the first search voltage SL_1 and the second search voltage SL_2 can have different settings. In FIG. 3, the settings of the first threshold voltage, the second threshold voltage, the first search voltage SL_1 and the second search voltage SL_2 can be obtained with reference to the following tables, and relevant details are omitted here:

| Storage data | First threshold voltage | Second threshold voltage |
|---|---|---|
| 0000 | VT1 | VT16 |
| 0001 | VT2 | VT15 |
| 0010 | VT3 | VT14 |
| 0011 | VT4 | VT13 |
| 0100 | VT5 | VT12 |
| 0101 | VT6 | VT11 |
| 0110 | VT7 | VT10 |
| 0111 | VT8 | VT9 |
| 1000 | VT9 | VT8 |
| 1001 | VT10 | VT7 |
| 1010 | VT11 | VT6 |
| 1011 | VT12 | VT5 |
| 1100 | VT13 | VT4 |
| 1101 | VT14 | VT3 |
| 1110 | VT15 | VT2 |
| 1111 | VT16 | VT1 |
| XXXX (don't care) | VT1 | VT1 |
| Invalid data | ≥VT16 | |

| Search data | First search voltage SL_1 | Second search voltage SL_2 |
|---|---|---|
| 0000 | VS1 | VS16 |
| 0001 | VS2 | VS15 |
| 0010 | VS3 | VS14 |
| 0011 | VS4 | VS13 |

-continued

| | | |
|---|---|---|
| 0100 | VS5 | VS12 |
| 0101 | VS6 | VS11 |
| 0110 | VS7 | VS10 |
| 0111 | VS8 | VS9 |
| 1000 | VS9 | VS8 |
| 1001 | VS10 | VS7 |
| 1010 | VS11 | VS6 |
| 1011 | VS12 | VS5 |
| 1100 | VS13 | VS4 |
| 1101 | VS14 | VS3 |
| 1110 | VS15 | VS2 |
| 1111 | VS16 | VS1 |
| wildcard (WC) | VS16 | VS16 |

In the third embodiment of the present application, when the storage data is a first predetermined storage data (0000), the first threshold voltage is VT1 (also referred as a minimum threshold voltage value) and the second threshold voltage is VT16 (also referred as a maximum threshold voltage value); when the storage data is a second predetermined storage data (1111), the first threshold voltage is the maximum threshold voltage value and the second threshold voltage is the minimum threshold voltage value; when the storage data is a third predetermined storage data (XXXX (don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the third embodiment of the present application, the storage data of the CAM cells 300 is based on a combination of the first threshold voltage and the second threshold voltage.

In the third embodiment of the present application, when the search data is a first predetermined search data (0000), the first search voltage SL_1 is VS1 (also referred as a minimum search voltage value) and the second search voltage SL_2 is VS16 (also referred as a maximum search voltage value); when the search data is a second predetermined search data (1111), the first search voltage SL_1 is the maximum search voltage value and the second search voltage SL_2 is the minimum search voltage value; when the search data is a third predetermined search data (WC), the first search voltage SL_1 and the second search voltage SL_2 both are the maximum search voltage value.

In the third embodiment of the present application, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is not turned on, and no matching current will be generated, indicating that the search result is "mismatch". That is, in the present application, the matching conditions of the storage data and search data of the third embodiment are similar to that of the first embodiment and the second embodiment, and relevant details are omitted here.

Fourth Embodiment

Figure 4:
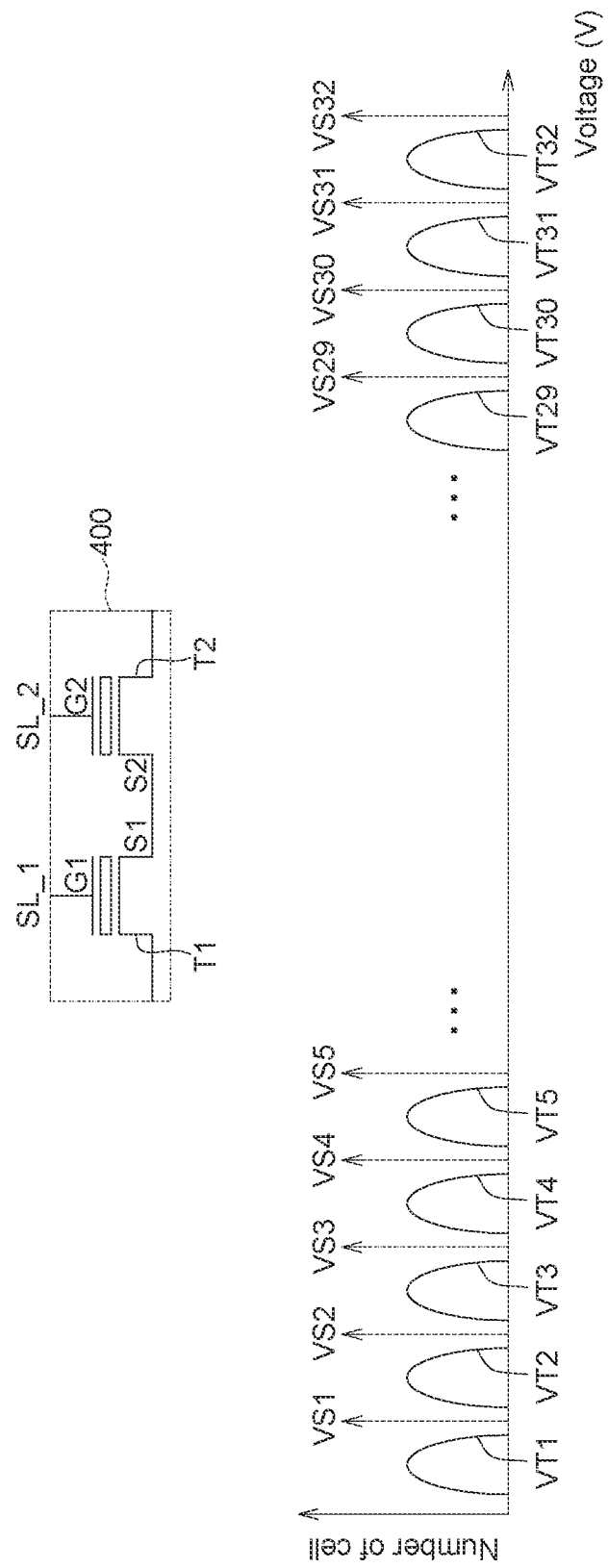
FIG. 4 is a schematic diagram of a CAM cell and its operation according to a fourth embodiment of the present application.

Referring to FIG. 4, a schematic diagram of a CAM cells 400 and its operation according to a fourth embodiment of the present application is shown. The CAM cells 400 can be realized by but is not limited to a penta-level CAM (PLC) capable of storing 5 bits.

In the fourth embodiment of the present application, the first threshold voltage, the second threshold voltage, the first search voltage SL_1 and the second search voltage SL_2 can have different settings. In FIG. 4, the settings of the first threshold voltage, the second threshold voltage, the first search voltage SL_1 and the second search voltage SL_2 can be obtained with reference to the following tables, and relevant details are omitted here:

| Storage data | First threshold voltage | Second threshold voltage |
|---|---|---|
| 00000 | VT1 | VT32 |
| 00001 | VT2 | VT31 |
| 00010 | VT3 | VT30 |
| 00011 | VT4 | VT29 |
| 00100 | VT5 | VT28 |
| 00101 | VT6 | VT27 |
| 00110 | VT7 | VT26 |
| 00111 | VT8 | VT25 |
| 01000 | VT9 | VT24 |
| 01001 | VT10 | VT23 |
| 01010 | VT11 | VT22 |
| 01011 | VT12 | VT21 |
| 01100 | VT13 | VT20 |
| 01101 | VT14 | VT19 |
| 01110 | VT15 | VT18 |
| 01111 | VT16 | VT17 |
| 10000 | VT17 | VT16 |
| 10001 | VT18 | VT15 |
| 10010 | VT19 | VT14 |
| 10011 | VT20 | VT13 |
| 10100 | VT21 | VT12 |
| 10101 | VT22 | VT11 |
| 10110 | VT23 | VT10 |
| 10111 | VT24 | VT9 |
| 11000 | VT25 | VT8 |
| 11001 | VT26 | VT7 |
| 11010 | VT27 | VT6 |
| 11011 | VT28 | VT5 |
| 11100 | VT29 | VT4 |
| 11101 | VT30 | VT3 |
| 11110 | VT31 | VT2 |
| 11111 | VT32 | VT1 |
| XXXXX (don't care) | VT1 | VT1 |
| Invalid data | | ≥VT32 |

| Search data | First search voltage SL_1 | Second search voltage SL_2 |
|---|---|---|
| 00000 | VS1 | VS32 |
| 00001 | VS2 | VS31 |
| 00010 | VS3 | VS30 |
| 00011 | VS4 | VS29 |
| 00100 | VS5 | VS28 |
| 00101 | VS6 | VS27 |
| 00110 | VS7 | VS26 |
| 00111 | VS8 | VS25 |
| 01000 | VS9 | VS24 |
| 01001 | VS10 | VS23 |
| 01010 | VS11 | VS22 |
| 01011 | VS12 | VS21 |
| 01100 | VS13 | VS20 |
| 01101 | VS14 | VS19 |
| 01110 | VS15 | VS18 |
| 01111 | VS16 | VS17 |
| 10000 | VS17 | VS16 |
| 10001 | VS18 | VS15 |
| 10010 | VS19 | VS14 |
| 10011 | VS20 | VS13 |
| 10100 | VS21 | VS12 |
| 10101 | VS22 | VS11 |
| 10110 | VS23 | VS10 |
| 10111 | VS24 | VS9 |
| 11000 | VS25 | VS8 |
| 11001 | VS26 | VS7 |
| 11010 | VS27 | VS6 |
| 11011 | VS28 | VS5 |
| 11100 | VS29 | VS4 |

-continued

| | | |
|---|---|---|
| 11101 | VS30 | VS3 |
| 11110 | VS31 | VS2 |
| 11111 | VS32 | VS1 |
| Wildcard (WC) | VS32 | VS32 |

In the fourth embodiment of the present application, when the storage data is a first predetermined storage data (00000), the first threshold voltage is VT1 (also referred as a minimum threshold voltage value) and the second threshold voltage is VT32 (also referred as a maximum threshold voltage value); when the storage data is a second predetermined storage data (11111), the first threshold voltage is the maximum threshold voltage value and the second threshold voltage is the minimum threshold voltage value; when the storage data is a third predetermined storage data (XXXXX (don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the fourth embodiment of the present application, the storage data of the CAM cells 400 is based on a combination of the first threshold voltage and the second threshold voltage.

In the fourth embodiment of the present application, when the search data is a first predetermined search data (00000), the first search voltage SL_1 is VS1 (also referred as a minimum search voltage value) and the second search voltage SL_2 is VS32 (also referred as a maximum search voltage value): when the search data is a second predetermined search data (11111), the first search voltage SL_1 is the maximum search voltage value and the second search voltage SL_2 is the minimum search voltage value: when the search data is a third predetermined search data (WC), the first search voltage SL_1 and the second search voltage SL_2 both are the maximum search voltage value.

In the fourth embodiment of the present application, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is not turned on, and no matching current will be generated, indicating that the search result is "mismatch". That is, in the present application, the matching conditions of the storage data and search data of the fourth embodiment are similar to that of the first embodiment, the second embodiment, and the third embodiment, and relevant details are omitted here.

Fifth Embodiment

Figure 5A:
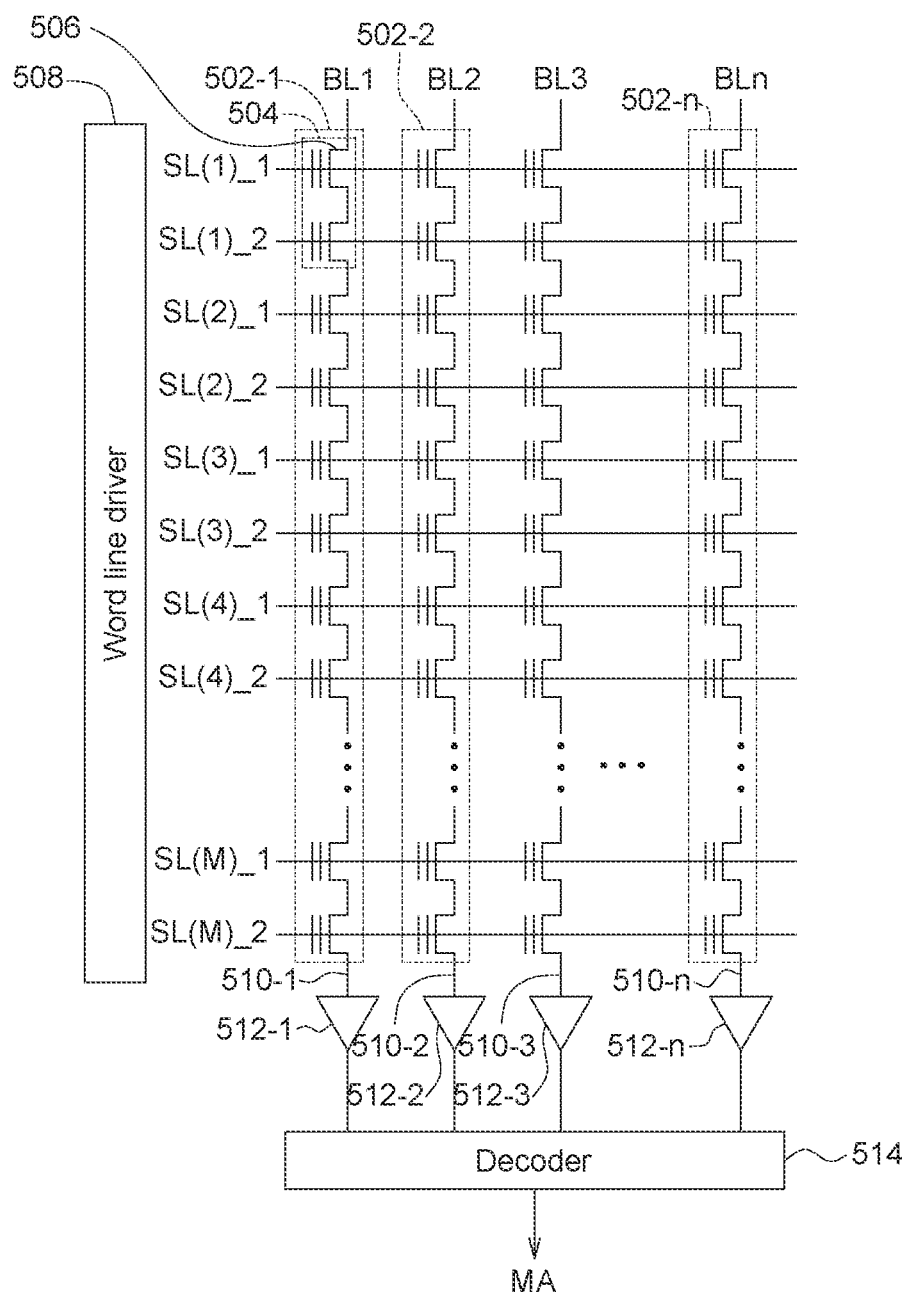
FIG. 5A is a circuit diagram of a CAM device according to a fifth embodiment of the present application.
Figure 5B:
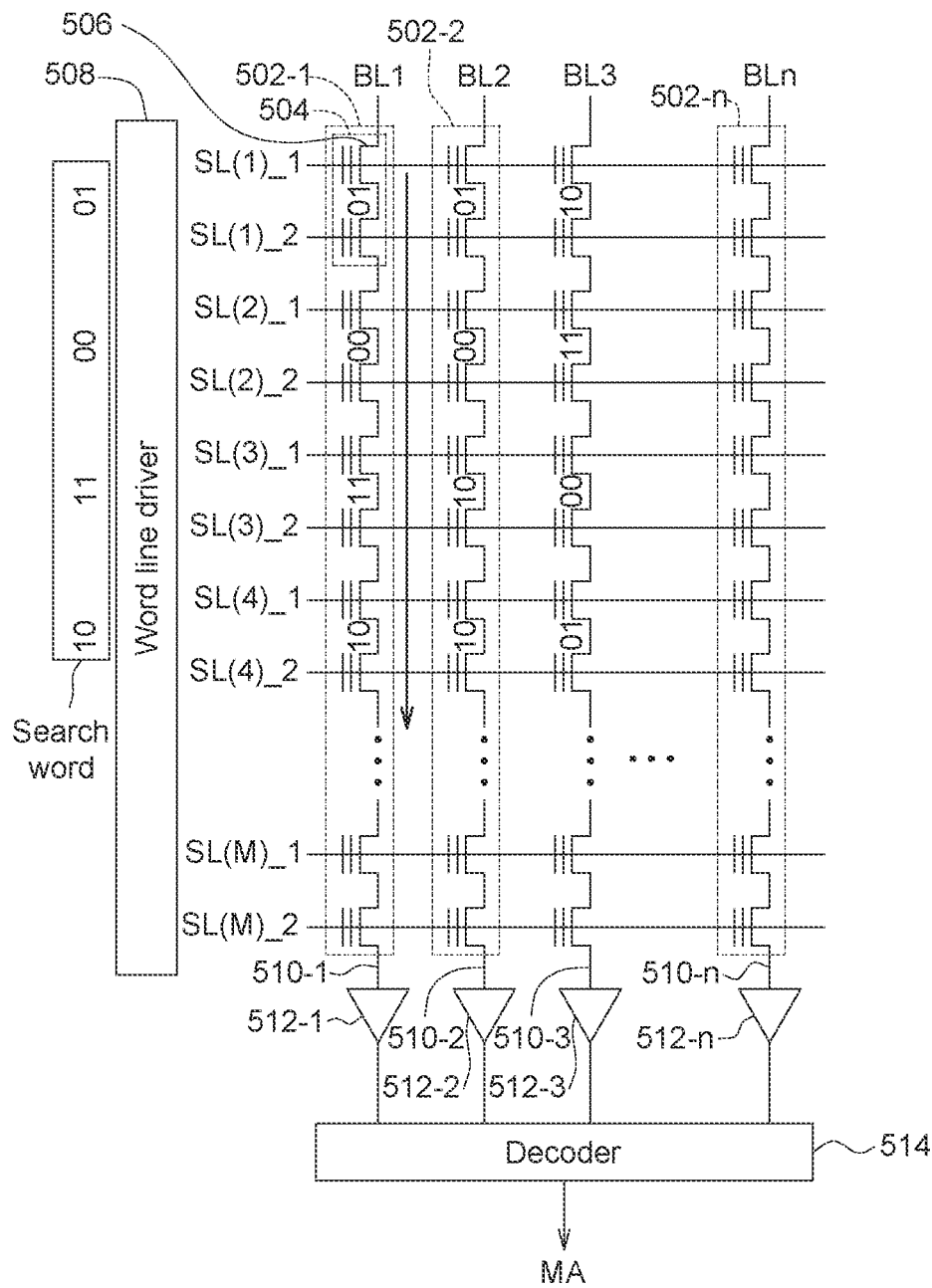
FIG. 5B is an operation diagram of a CAM device according to a fifth embodiment.

FIG. 5A is a circuit diagram of a CAM device 500A according to a fifth embodiment of the present application. FIG. 5B is an operation diagram of the CAM device 500A according to the fifth embodiment.

As indicated in FIG. 5A, the CAM memory device 500A according to the fifth embodiment includes a plurality of CAM cell strings 502-1~502-n, a word line driver 508, a plurality of matching lines 510-1~510-n, a plurality of sense amplifiers 512-1-512-n, and a decoder 514.

The CAM cell strings 502-1~502-n include a plurality of CAM cells 504, which include a plurality of serial-coupled flash memory cells 506. The CAM cells 504 can be identical or similar to the CAM cells 100 of the first embodiment, the CAM cells 200 of the second embodiment, the CAM cells 300 of the third embodiment, and the CAM cells 400 of the fourth embodiment.

The word line driver 508 is configured to provide a plurality of first search voltages SL (1)_1, SL (2)_1, . . . , SL (M)_1 and a plurality of second search voltages SL (1)_2, SL (2)_2, . . . , SL (M)_2 to the CAM cells 504. The bit line voltages BL1~BLn are applied on the CAM cell strings 502-1~502-n. The matching lines 510-1~510-n are coupled to the CAM cells 504. The sense amplifiers 512-1~510-n are coupled to the matching lines 510-1~510-n. The decoder 514 is coupled to the sense amplifiers 512-1~510-n.

In the fifth embodiment of the present application, a storage data of the CAM cells 504 is based on a combination of a plurality of threshold voltages of the flash memory cells 506 of the CAM cells 504, and the settings of the threshold voltages of the CAM cells 504 can be identical or similar to that of the first embodiment, the second embodiment, the third embodiment and the fourth embodiment. The settings of the first search voltages SL (1)_1, SL (2)_1, . . . , SL (M)_1 and the second search voltage SL (1)_2, SL (2)_2, . . . , SL (M)_2 can be identical or similar to that of the first embodiment, the second embodiment, the third embodiment and the fourth embodiment. Therefore, relevant details can be omitted here.

When the first search voltages SL (1)_1, SL (2)_1, . . . , SL (M)_1 and the second search voltages SL (1)_2, SL (2)_2, . . . , SL (M)_2 are applied on the CAM cells 504, the sense amplifiers 512-1~510-n sense a plurality of matching currents on the matching lines 510-1~510-n to generate a plurality of first sensing results. According to the first sensing results, the decoder 514 generates a matched address MA, indicating that the addresses of the CAM cells 504 having a matched search result.

In FIG. 5A, the search data includes a plurality of search words, and the storage data of the CAM cells 504 includes a plurality of data words.

The operations of the fifth embodiment can be better understood with reference to FIG. 5B. Let the settings of the threshold voltages and search voltages as disclosed in the first embodiment, that is, the search word is [10110001], the first data word (Data word 1) is [10110001], the second data word (Data word 2) is [10100001], and the third data word (Data word 3) is [01001110], be taken for example, but the present application is not limited thereto.

When the CAM cell string 502-1 (storing the first data word [10110001]) is searched using the search word [10110001], all flash memory cells of all CAM cells 504 of the CAM cell string 502-1 are turned on, therefore a matching current is generated on the relevant matching line 510-1. When the first data word [10110001] is searched using the search word [10110001], the search result is "match", and MA represents the address of the CAM cell of the CAM cell string 502-1.

Similarly, when the CAM cell string 502-2 (storing the second data word [10100001]) is searched using the search word [10110001], at least one of the flash memory cells of the CAM cells 504 of the CAM cell string 502-2 is turned off, therefore no matching current is generated on the relevant matching line 510-2. When the second data word [10100001] is searched using the search word [10110001], the search result is "mismatch".

By the same analogy, when the third data word [01001110] is searched using the search word [10110001], the search result is "mismatch".

Sixth Embodiment

Figure 6A:
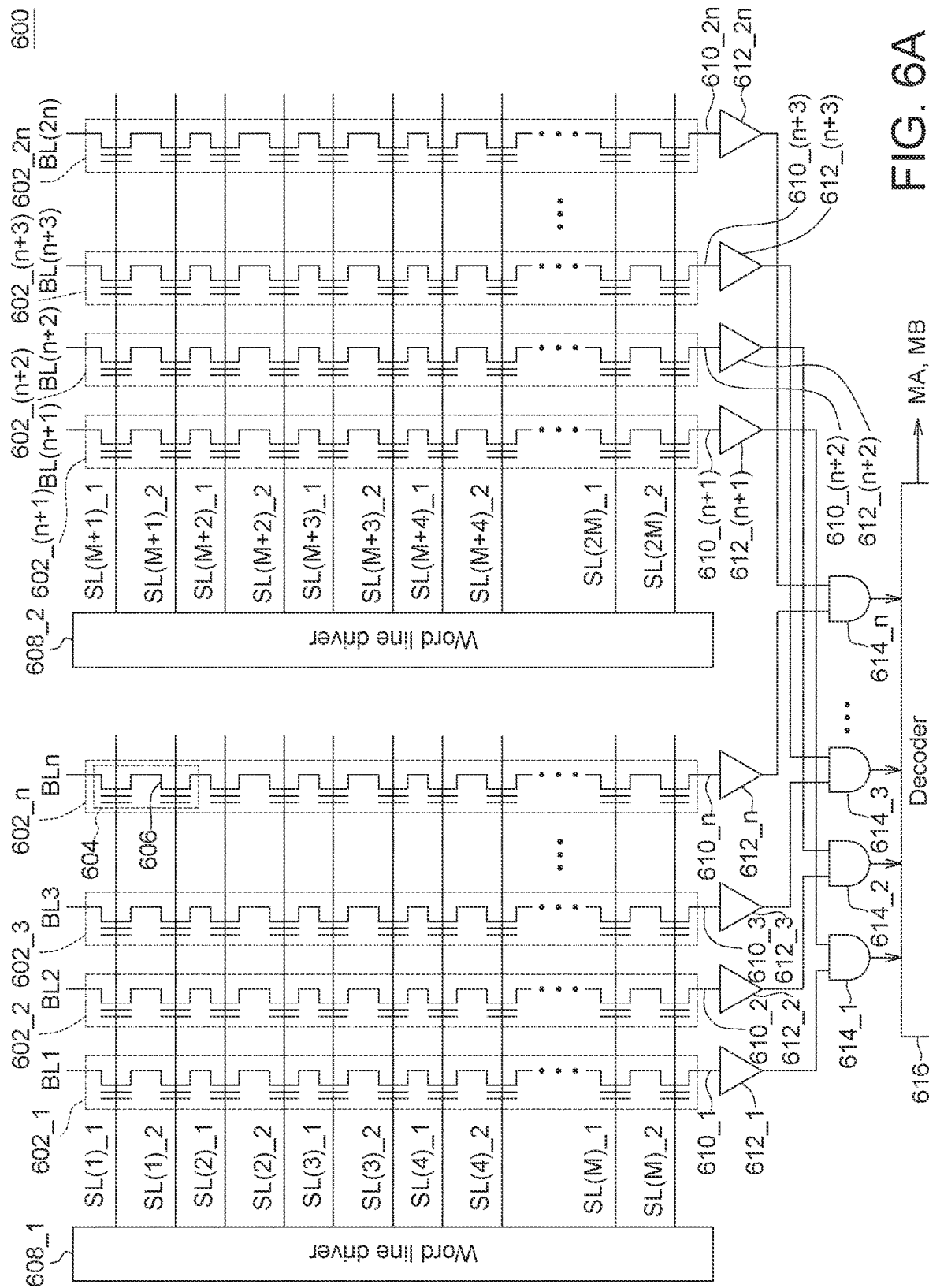
FIG. 6A is a circuit diagram of a CAM device according to a sixth embodiment of the present application.
Figure 6B:
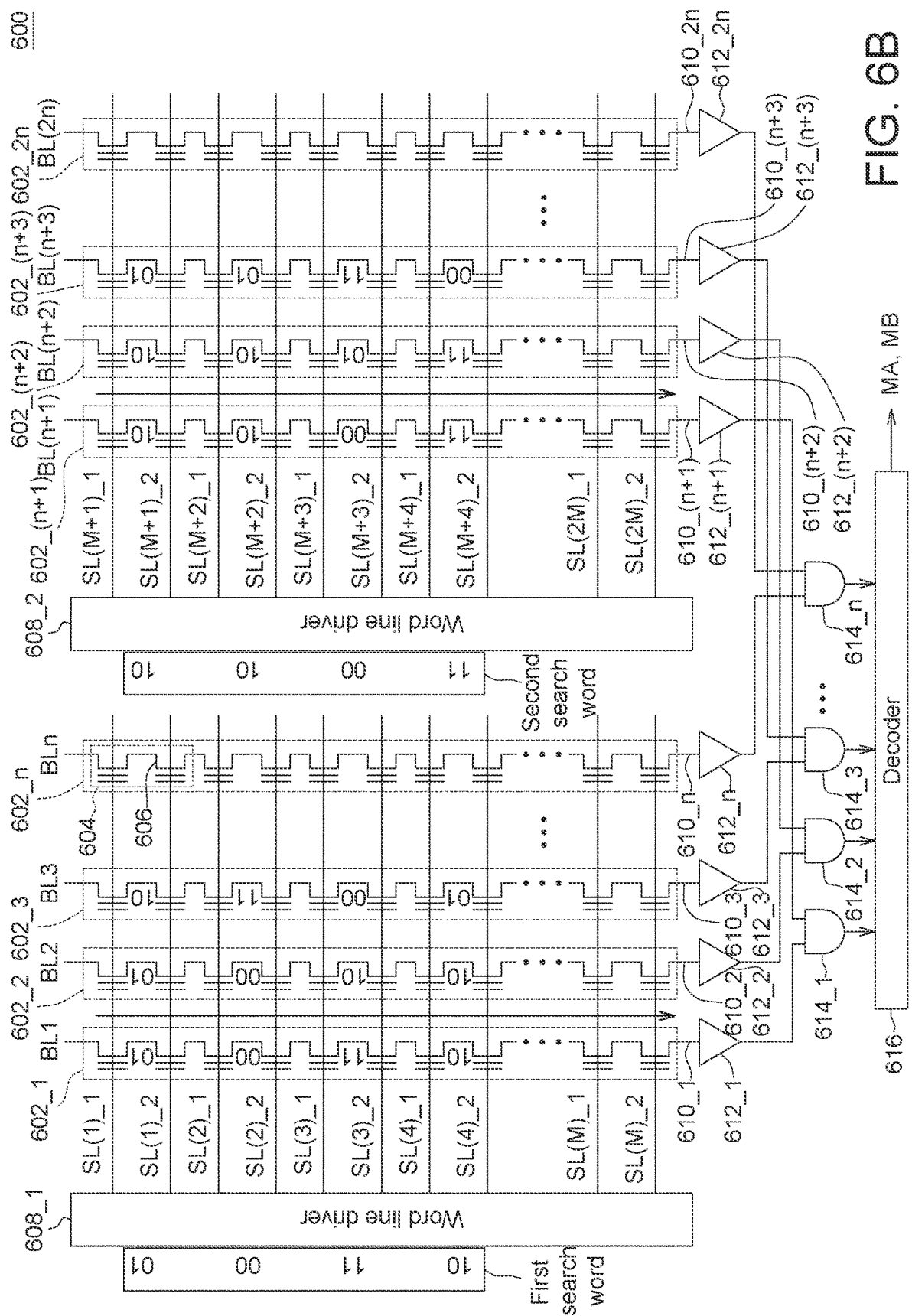
FIG. 6B is an operation diagram of the CAM device according to the sixth embodiment.

FIG. 6A is a circuit diagram of a CAM device 600 according to a sixth embodiment of the present application. FIG. 6B is an operation diagram of the CAM device 600 according to the sixth embodiment.

As indicated in FIG. 6A, the CAM memory device 600 according to the sixth embodiment includes a plurality of CAM cell strings 602-1~602-2n, word line drivers 608-1 and 608-2, a plurality of matching lines 610-1~610-2n, a plurality of sense amplifiers 612-1~612-2n, a plurality of logic gates 614-1~614n, and a decoder 616.

The CAM cell strings 602-1~602-2n include a plurality of CAM cells 604, which include a plurality of serial-coupled flash memory cells 606. The CAM cells 604 can be identical or similar to the CAM cells 100 of the first embodiment, the CAM cells 200 of the second embodiment, the CAM cells 300 of the third embodiment, and the CAM cells 400 the fourth embodiment.

The word line driver 608-1 is configured to provide a plurality of first search voltages SL (1)_1, SL (2)_1, . . . , SL (M)_1 and a plurality of second search voltages SL (1)_2, SL (2)_2, . . . , SL (M)_2 to the CAM cells 604. The word line driver 608-2 is configured to provide a plurality of third search voltages SL (M+1)_1, SL (M+2)_1, . . . , SL (2M)_1 and a plurality of fourth search voltages SL (M+1)_2, SL (M+2)_2, . . . , SL (2M)_2 to the CAM cells 604.

The bit line voltages BL1~BL (2n) are applied on the CAM cell strings 602-1~602-2n. The matching lines 610-1~610-2n are coupled to the CAM cells 604.

The sense amplifiers 612-1-612-2n are coupled to the matching lines 610-1~610-2n for sensing the matching current generated by the CAM cell strings 602-1~602-2n.

The logic gates 614-1~614-n receive the sensing results from corresponding sense amplifiers 612-1~612-2n and output the results of logic operations to the decoder 616. For example, the logic gate 614-1 receives the sensing result from corresponding sense amplifiers 612-1 and 612-(n+1) and outputs the results of logic operations to the decoder 616. The logic gates 614-1~614-n can be realized but is not limited to AND logic gates.

In the sixth embodiment of the present application, a storage data of the CAM cells 604 is based on a combination of a plurality of threshold voltages of the flash memory cells 606 of the CAM cells 604. The settings of the threshold voltages of the CAM cells 604 can be identical or similar to that of the first embodiment, the second embodiment, the third embodiment and the fourth embodiment. The settings of the search voltages SL (1)_1~SL (2M)_2 can be identical or similar to the first embodiment, the second embodiment, the third embodiment and the fourth embodiment. Therefore, relevant details can be omitted here.

When the first search voltages SL (1)_1, SL (2)_1, . . . , SL (M)_1, the second search voltages SL (1)_2, SL (2)_ 2, . . . , SL (M)_2, the third search voltages SL (M+1)_1, SL (M+2)_1, . . . , SL (2M)_1, and the fourth search voltages SL (M+1)_2. SL (M+2)_2, . . . , ~SL (2M)_2 are applied on the CAM cells 604, the sense amplifiers 612-1~612-2n sense a plurality of matching currents on the matching lines 610-1~610-2n to generate a plurality of first and second sensing results. The logic gates 614-1-~614-n perform logic operations according to the first sensing results of the sense amplifiers 612-1~612-n and the second sensing results of the sense amplifiers 612-(n+1)~612-2n to generate a plurality of results of logic operations. The decoder 616 generates matched addresses MA and MB according to the results of logic operations of the first and second sensing results. The matched addresses MA and MB indicate the addresses of the matched CAM cell 604 having a matched search result.

In FIG. 6A, the search data includes a plurality of search words, and the storage data of the CAM cells 604 includes a plurality of data words.

The sixth embodiment is applicable to long search words. A long search word can be divided into 2 words (or more words), and details are disclosed below.

The operations of the fifth embodiment can be better understood with reference to FIG. 6B. The settings of the threshold voltages and search voltages are as disclosed in the first embodiment. The long search word is divided into a first search word [10110001] and a second search word [11001010]. The long data word is divided into a first data word (Data word 1) being [10110001] (stored in the CAM cell string 602-1) and a second data word (Data word 2) being [11001010] (stored in the CAM cell string 602-(n+1)). Similarly, another long data word is divided into a third data word (Data word 3) being [01001110] (stored in the CAM cell string 602-2) and a fourth data word (Data word 4) being [11001010] (stored in the CAM cell string 602-(n+2)). Similarly, another long data word is divided into a fifth data word (Data word 5) being [11011010] (stored in the CAM cell string 602-3) and a sixth data word (Data word 6) being [00110101] (stored in the CAM cell string 602-(n+3)). The above exemplifications are for description purpose only, and the present application is not limited thereto.

When the first data word [10110001] is searched using the first search word [10110001], all the flash memory cells of all the CAM cells 604 of the CAM cell string 602-1 are turned on to generate a matching current. Therefore, when the first data word [10110001] is searched using the first search word [10110001], the search result is "match" and the sense amplifier 612-1 senses the matching current to generate a logic value 1 (that is, the first sensing result). Similarly, when the second data word [11001010] is searched using the second search word [11001010], all the flash memory cells of all the CAM cells 604 of the CAM cell string 602-(n+1) are turned on to generate a matching current. Therefore, when the second data word [11001010] is searched using the second search word [11001010], the search result is "match" and the sense amplifier 612-(n+1) senses the matching current to generate a logic value 1 (that is, the second sensing result). Since the two input ends of the logic gate 614-1 both are logic 1, the logic gate 614-1 outputs logic 1 to the decoder 616. The decoder 616 correspondingly generates matched addresses MA and MB, wherein the matched address MA represents the address of the CAM cells 604 of the CAM cell string 602-1; the matched address MB represents the address of the CAM cells 604 of the CAM cell string 602-(n+1).

By the same analogy, when the third data word [01001110] is searched using the first search word [10110001], the search result is "mismatch" and the sense amplifier 612-2 does not sense the matching current but generates a logic value 0 (that is, the first sensing result). By the same analogy, when the fourth data word [11001010] is searched using the second search word [11001010], the search result is "match" and the sense amplifier 612-(n+2) senses the matching current to generate a logic value 1 (that is, the second sensing result). Since neither of the two input ends of the logic gate 614-2 is logic 1, the logic gate 614-2 outputs logic 0 to the decoder 616.

By the same analogy, when the fifth data word [11011010] is searched using the first search word [10110001], the search result is "mismatch" and the sense amplifier 612-3 does not sense the matching current but generates a logic value 0 (that is, the first sensing result). By the same analogy, when the sixth data word [00110101] is searched using the second search word [11001010], the search result is "mismatch" and the sense amplifier 612-(n+3) does not sense the matching current to generate a logic value 0 (that is, the second sensing result). Since neither of the two input ends of the logic gate 614-3 is logic 1, the logic gate 614-3 outputs logic 0 to the decoder 616.

Thus, the CAM memory device 600 can perform search using long search words to increase the efficiency of the CAM device. Moreover, the CAM memory device 600 further reduces the length of the CAM cell string (such as NAND string), not only to reducing the RC delay but further speeding up the response rate of the CAM device.

Seventh Embodiment

Figure 7:
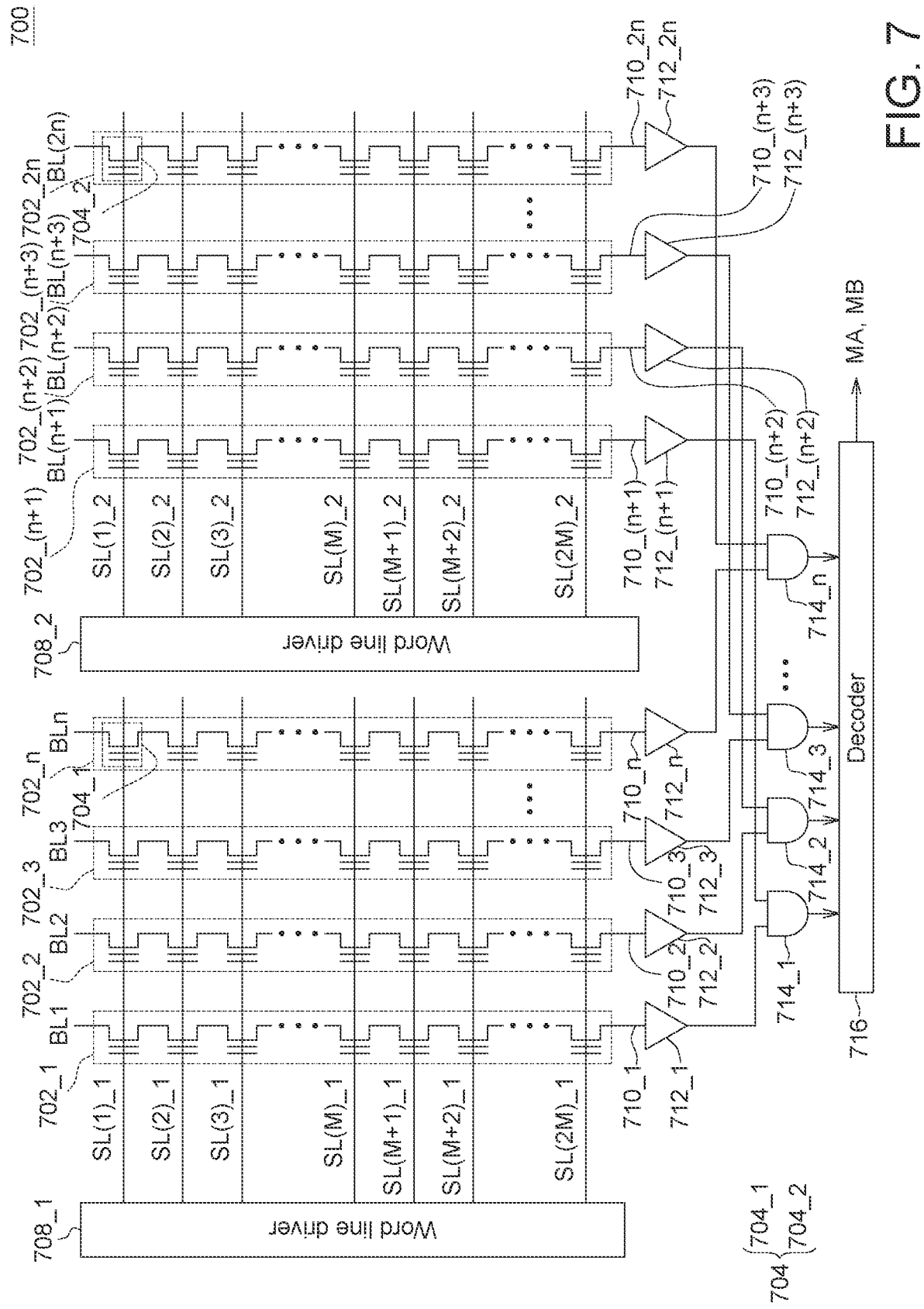
FIG. 7 is a circuit diagram of a CAM device according to a seventh embodiment of the present application.

FIG. 7 is a circuit diagram of a CAM device 700 according to a seventh embodiment of the present application.

As indicated in FIG. 7, the CAM memory device 700 according to the seventh embodiment includes a plurality of CAM cell strings 702-1~702-2n, word line drivers 708-1 and 708-2, a plurality of matching lines 710-1~710-2n, a plurality of sense amplifiers 712-1~712-2n, a plurality of logic gates 714-1~714n, and a decoder 716. The bit line voltages BL1~ BL (2n) are applied on the CAM cell strings 702-1~702-2n. The storage data, the settings of threshold voltages, and the matching operations of the CAM cells 704 of the CAM memory device 700 can be identical or similar to that of the CAM memory device 600 of the sixth embodiment, and relevant details are omitted here.

In the seventh embodiment, the CAM cell 704 exemplarily includes two flash memory cells, respectively belonging to different CAM cell strings. For example, the CAM cell 704 includes two flash memory cells 704-1 and 704-2, respectively belonging to the CAM cell strings 702-n and 702-2n.

Eighth Embodiment

Referring to FIG. 8A to FIG. 8D, schematic diagrams of a CAM device 800 and its four operations according to an eighth embodiment are shown.

As indicated in FIG. 8A to FIG. 8D, the CAM device 800 includes a plurality of CAM cell strings 802, a word line decoder and driver 808, a bit line driver 810, a plurality of matching lines 812, a plurality of sense counting circuits (SC) 814-1~814-n, and a decoder 816.

The CAM cell strings 802 include a plurality of CAM cells 804, which include a plurality of flash memory cells 806. The CAM cells 804 can be identical or similar to the CAM cells 100 of the first embodiment, the CAM cells 200 of the second embodiment, the CAM cells 300 of the third embodiment, the CAM cells 400 of the fourth embodiment, the CAM cells 504 of the fifth embodiment, and the CAM cells 604 of the sixth embodiment.

The word line decoder and driver 808 is configured to provide a plurality of search voltages SL to the CAM cells 804. The matching lines 812 are coupled to the CAM cells 804. The sense counting circuits 814-1-814-n are coupled to the matching lines 812. The decoder 816 is coupled to the sense counting circuits 814-1~814-n.

Each of the sense counting circuits 814-1~814-n includes a plurality of sense amplifiers SA and a counter C. The sense amplifiers SA are configured to sense whether the corresponding CAM cell string 802 has a matching current. For example, the sense counting circuit 814-1 is coupled to the first to the $6^{th}$ CAM cell strings 802 for sensing the matching current of the first to the $6^{th}$ CAM cell strings 802; the sense counting circuit 814-2 is coupled to the $4^{th}$ to the $9^{th}$ CAM cell strings 802 for sensing the matching current of the $4^{th}$ to the $9^{th}$ CAM cell strings 802; and the rest can be obtained by the same analogy.

When sensing the matching current of the corresponding CAM cell string 802, the sense amplifiers SA output the sensing result to the counter C. Then, the counter C counts the quantity of the sense amplifiers SA outputting the sensing result and outputs the counted quantity as a counting result.

Figure 8A:
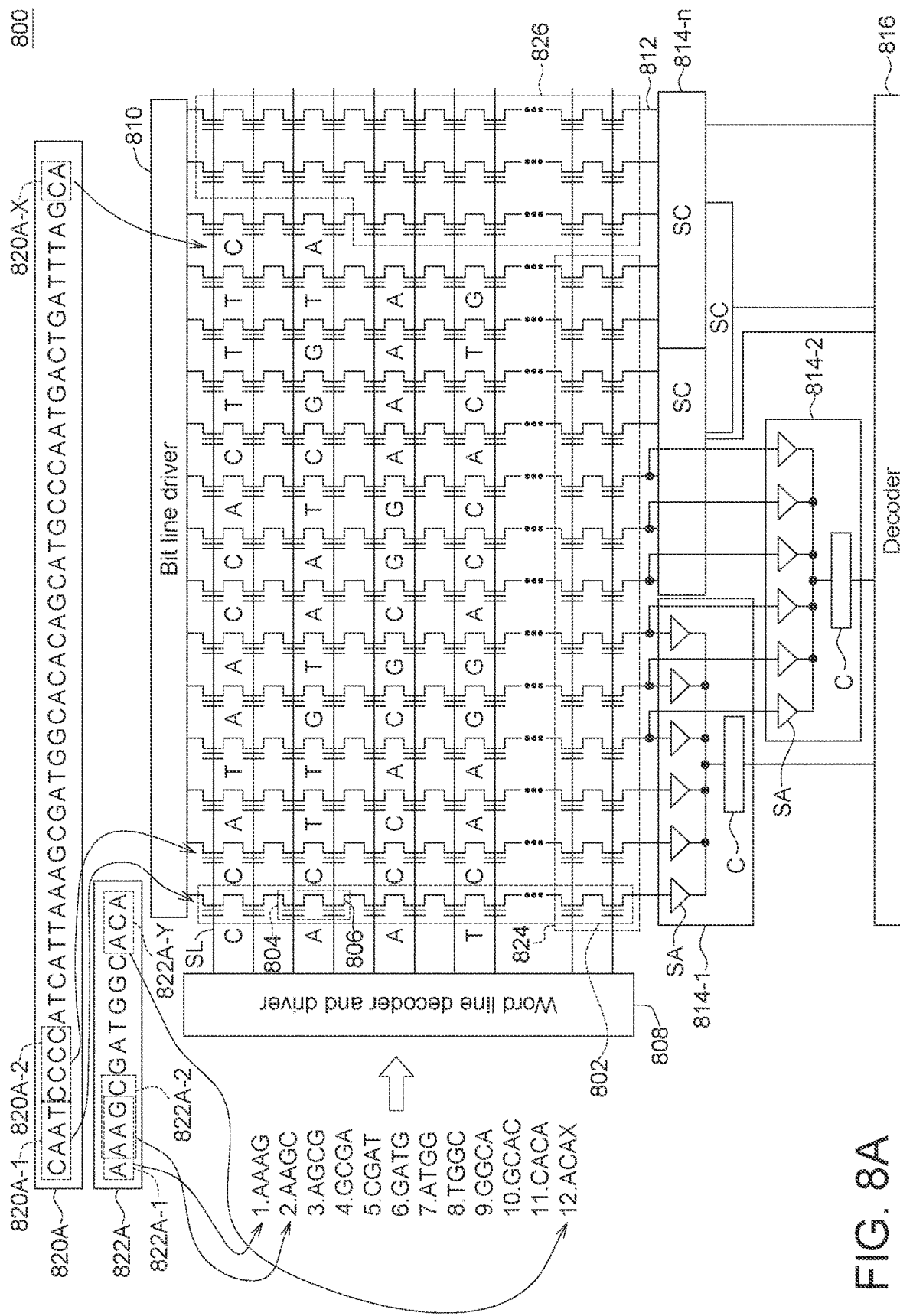
FIG. 8A is a schematic diagram of a CAM cell and its operation according to an eighth embodiment.

In the eighth embodiment of the present application, individual storage data of the CAM cell string 802 is related to a portion of a reference string data 820A. The reference string data 820A includes but is not limited to genomes. As indicated in FIG. 8A, the reference string data 820A includes a plurality of portions 820A-1~820A-X (X is a positive integer). The reference string data 820A includes but is not limited to CAATCCCCATCATTAAAGC-GATGGCACACAGCATGCCCAATGACTGATTTA GCA. The first portion 820A-1 of the reference string data 820A, which includes the $1^{st}$ to the $4^{th}$ data bits (CAAT), is stored in the first CAM cell string 802; the second portion 820A-2 of the reference string data 820A, which includes the $5^{th}$ to the $8^{th}$ data bits (CCCC), is stored in the $2^{nd}$ CAM cell string 802; and the rest can be obtained by the same analogy. The $X^{th}$ portion 820A-X of the reference string data 820A, which includes the last two data bits (CA), is stored in one of the CAM cell strings 802. The above reference string data selection method is not based on sliding and therefore is referred as fixed reference string data selection method.

In a plurality of comparison rounds, the word line decoder and driver 808 determines the search voltages SL applied on the CAM cells 804 according to a data read 822A. In each comparison round, the word line decoder and driver 808 selects one of the seed data 822A-1~822A-Y from the data read 822A, the word line decoder and driver 808 determines the search voltages SL applied on the CAM cells 804 according to the selected one of the seed data 822A-1~822A-Y. Y is a positive integer, and in the example of FIG. 8A, Y=12, but the present application is not limited thereto.

As indicated in FIG. 8A, the data read 822A includes a plurality of data bits, including but not limited to AAAGC-GATGGCACA. The $1^{st}$ to the $4^{th}$ data bits (AAAG) of the data read 822A are set as the seed data 822A-1 in the $1^{st}$ comparison round: the $2^{nd}$ to the $5^{th}$ data bits (AAGC) of the data read 822A are set as the seed data 822A-2 in the $2^{nd}$ comparison round; and the rest can be obtained by the same analogy. This is referred as sliding seed data selection method.

When the quantity of data bits of the seed data in the last comparison round or the last few comparison rounds is smaller, one or more than one wildcard (WC) X is added to the seed data whose quantity of data bits is smaller, such that the quantity of data bits of the seed data in the last comparison round or the last few comparison rounds will be equivalent to the quantity of data bits of the seed data in previous comparison rounds. As indicated in FIG. 8A, the seed data 822A-12 in the last comparison round, being the last 3 data bits (ACA) of the data read 822A, has a smaller quantity of data bits, therefore a wildcard X is added to the seed data 822A-12 in the last comparison round, such that the quantity of data bits of the seed data 822A-12 in the last comparison round will be equivalent to the quantity of data bits of the seed data in previous comparison rounds. With the wildcard X being added to the seed data in the last comparison round or the last few comparison rounds, the seed data in each comparison round will have the same quantity of data bits.

In the eighth embodiment, A, T, C and G, exemplarily but not restrictively, represent 00, 01, 10, 11. For example, when A is written to the CAM cell 804, the storage data 00 is stored in the CAM cell 804. Similarly, when the seed data 822A-1 is AAAG, the search voltages are set as 00, 00, 00, 11, and the rest can be obtained by the same analogy. The settings of threshold voltages and search voltages can be obtained with reference to previous embodiments, and the details are not repeated here.

Therefore, in the comparison rounds, when the search voltages SL are applied on the CAM cells 804, the sense counting circuits 814-1~814-$n$ sense and count a plurality of matching currents on the matching lines 812 to generate a plurality of counting results, and the decoder 816 determines whether the data read 822A matches the reference string data 820A according to the counting results of the sense counting circuits 814-1~-14-$n$.

As indicated in FIG. 8A, individual storage data of the $5^{th}$ to the $7^{th}$ CAM cell strings 802 respectively match the seed data 822A-3 (AGCG) in the $3^{rd}$ comparison round, the seed data 822A-7 (ATGG) in the $7^{th}$ comparison round, and the seed data 822A-11 (CACA) in the $11^{th}$ comparison rounds, and correspondingly generate 3 matching currents. The sense counting circuit 814-1 corresponding to the $5^{th}$ to the $6^{th}$ CAM cell strings 802 senses and counts 2 matching currents and generates a counting result (2), the sense counting circuit 814-2 corresponding to the $5^{th}$ to the $7^{th}$ CAM cell strings 802 senses and counts 3 matching currents and generates a counting result (3), the sense counting circuit 814-3 corresponding to the $7^{th}$ CAM cell strings 802 senses and counts 1 matching current and generates a counting result (1), therefore, the sense counting circuit 814 having a highest counting result is selected as a candidate sense counting circuit. The above operation is referred as read mapping performed using a seed and voting strategy.

When the counting result of the candidate sense counting circuit of the sense counting circuits 814 is higher than a threshold (such as 2), the seed and voting strategy is successful, and the decoder 816 determines that the data read 822A matches the reference string data 820A. As indicated in FIG. 8A, the counting result (3) of the sense counting circuit 814-2 (that is, the candidate sense counting circuit) is greater than the threshold (2), therefore the seed and voting strategy is successful, and the decoder 816 determines that the data read 822A matches the reference string data 820A according to the counting result (3).

As indicated in FIG. 8A, when a valid length of the seed data 822A-1~822A-Y is less than a quantity of the CAM cells of the CAM cell string 802, a portion of the CAM cell string 802, such as region 824, stores an unimportant (don't care) storage data, such that all of the CAM cells 804 within the region 824 are turned on regardless of what search voltage is received. Or, when a valid length of the seed data 822A-1~822A-Y is less than a quantity of the CAM cells of the CAM cell string 802, a wildcard search voltage is applied on the CAM cells 804 within the region 824, such that all of the CAM cells 804 within the region 824 are turned on. The valid length refers to the quantity of data bits of the seed data inputted to the CAM cell string 802 in each comparison round.

Refer to FIG. 8A. When the portions 820A-1~820A-X of the reference string data 820A are all stored in the CAM cell strings 802, if there is any remaining CAM cells 804 (as indicated in region 826) not written by the reference string data 820A, invalid data will be written to the remaining CAM cells 804 (as in the first embodiment to the third embodiment). Thus, regardless of what search voltage is applied, no current will flow through the remaining CAM cells 804 within the region 826.

In an embodiment, the longer the data read, the larger the seed data. Therefore, when the read mapping has long data read and large reference string data, the uncertainty of voting can be reduced and the efficiency of the seed and voting strategy can be increased.

Thus, through the CAM device 800 of FIG. 8A and its operation, the data read and the reference string data can be correctly matched, and the misalignment problem of seed data can be resolved.

Figure 8B:
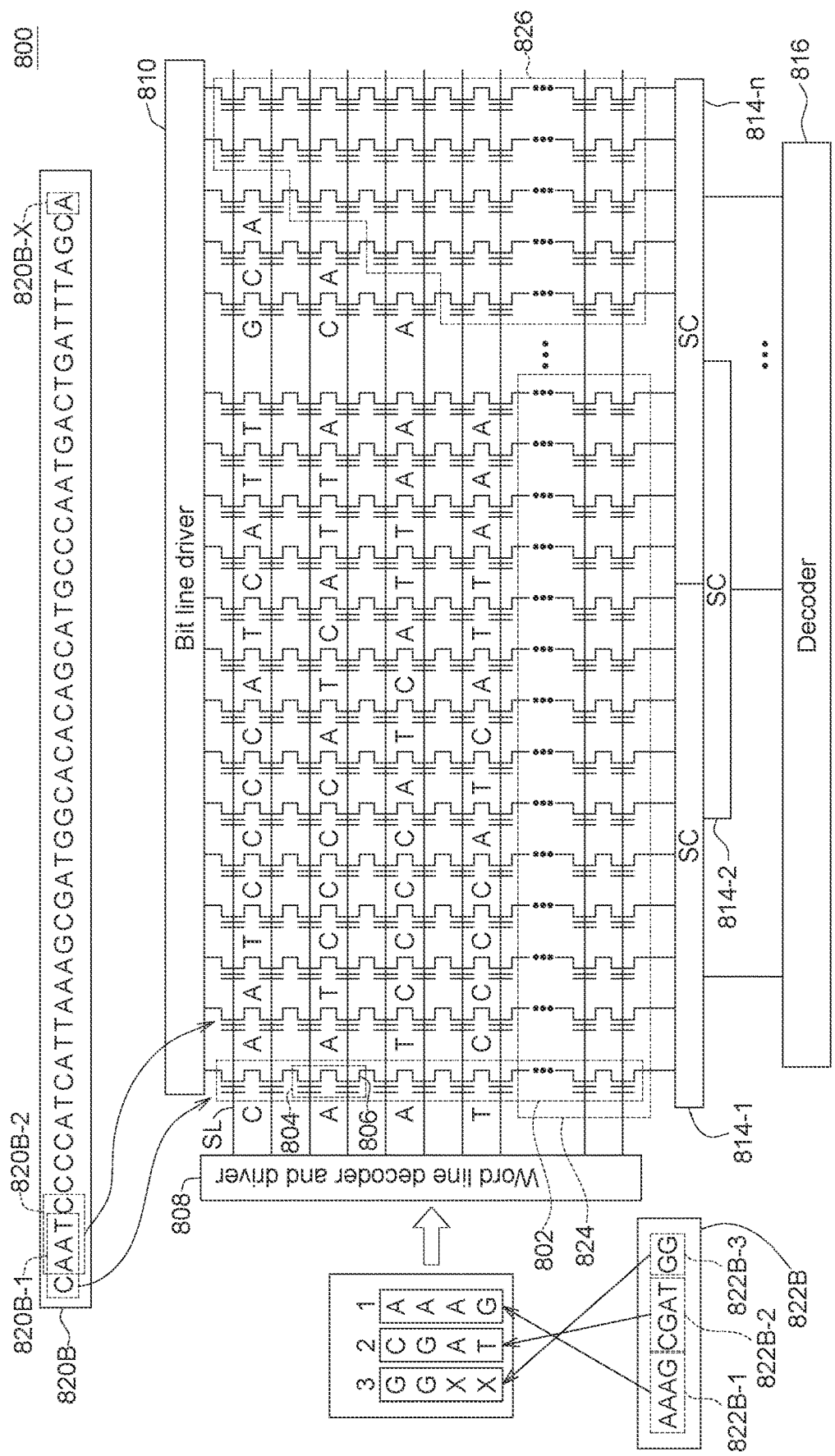
FIG. 8B is a schematic diagram of a second operation of the CAM device according to the eighth embodiment.

Referring to FIG. 8B, a schematic diagram of a second operation of the CAM device 800 according to the eighth embodiment is shown. The operation of the CAM device 800 of FIG. 8B is different from that of the CAM device 800 of FIG. 8A in that the CAM device 800 of FIG. 8B performs read mapping using the sliding reference string data method instead of the sliding seed method, and the details are disclosed below.

As indicated in FIG. 8B, the reference string data 820B includes a plurality of portions 820B-1~820B-X (X is a positive integer). The reference string data 820B includes but is not limited to CAATCCCCATCATTAAAGC-GATGGCACACAGCATGCCCAATGACTGATTTA GCA. The first portion 820A-1 of the reference string data 820B, which includes the $1^{st}$ to the $4^{th}$ data bits (CAAT), is stored in the $1^{st}$ CAM cell string 802; the second portion 820A-2 of the reference string data 820B, which includes the $2^{nd}$ to the $5^{th}$ data bits (AATC), is stored in the $2^{nd}$ CAM cell string 802; and the rest can be obtained by the same analogy. The $X^{th}$ portion 820B-X of the reference string data 820B, which includes the last data bit (A), is stored in one of the CAM cell strings 802. The above operation is referred as sliding reference string data method.

As indicated in FIG. 8B, the data read 822B includes a plurality of data bits, including but not limited to AAAGC-GATGGCACA. The $1^{st}$ to the $4^{th}$ data bits (AAAG) of the data read 822B are used as the seed data 822B-1 in the $1^{st}$ comparison round; the $5^{th}$ to the $8^{th}$ data bits (CGAT) of the data read 822B are used as the seed data 822B-2 in the $2^{nd}$ comparison round; and the rest can be obtained by the same analogy. The above selection of seed data is referred as fixed seed selection method.

The seed data 822B-3 in the $3^{rd}$ comparison round, being the last 2 data bits (GG) of the data read 822B, has a smaller quantity of data bits, therefore 2 wildcards XX are added to the seed data 822B-3 in the $3^{rd}$ comparison round, such that the quantity of data bits of the seed data 822B-3 in the $3^{rd}$ comparison round will be equivalent to the quantity of data bits of the seed data in previous comparison rounds.

Figure 8C:
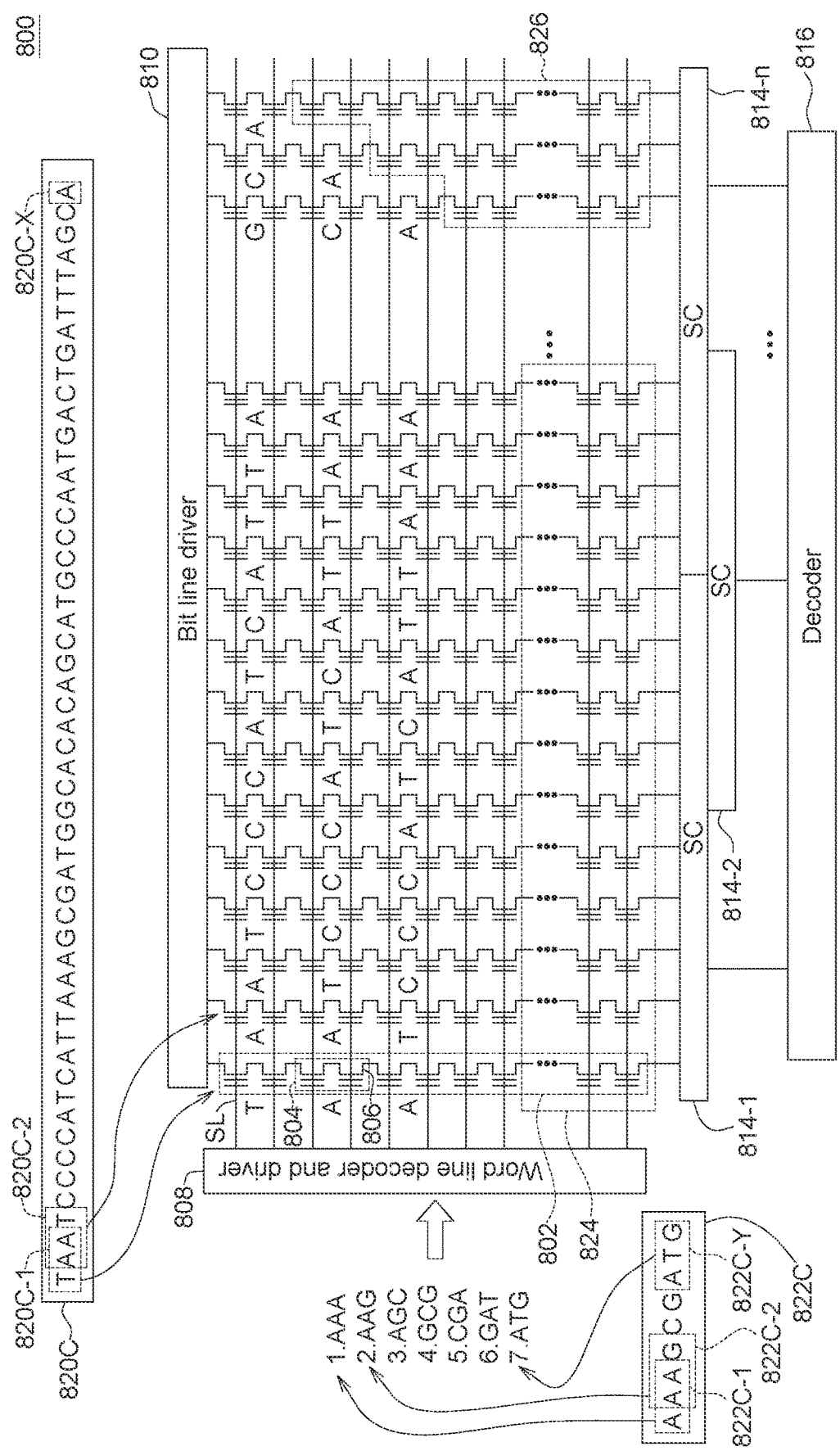
FIG. 8C is a schematic diagram of a third operation diagram of the CAM device according to the eighth embodiment.

Referring to FIG. 8C, a schematic diagram of a third operation of the CAM device 800 according to the eighth embodiment is shown. The operation of the CAM device 800 of FIG. 8C is different from that of the CAM device 800 of FIG. 8A and FIG. 8B in that the CAM device 800 of FIG. 8C performs read mapping using both the sliding seed method and the sliding reference string data method, and the details are disclosed below.

As indicated in FIG. 8C, the reference string data 820C includes a plurality of portions 820C-1~820C-X (X is a positive integer). The reference string data 820C includes but is not limited to TAATCCCCATCATTAAAGC-GATGGCACACAGCATGCCCAATGACTGATTTA GCA.

By using the sliding reference string data method, the $1^{st}$ to the $3^{rd}$ data bits (TAA) of the reference string data 820C are stored in the $1^{st}$ CAM cell strings 802, the $2^{nd}$ to the 4 data bits (AAT) of the reference string data 820C are stored in the $2^{nd}$ CAM cell string 802; and the rest can be obtained by the same analogy. The $X^{th}$ portion 820C-X of the reference string data 820C includes the last data bit (A) stored in one of the CAM cell strings 802.

As indicated in FIG. 8C, the data read 822C includes a plurality of data bits, including but not limited to AAAGC-GATG. By using the sliding seed method, the $1^{st}$ to the $3^{rd}$ data bits (AAA) of the data read 822C are used as the seed data 822C-1 of the $1^{st}$ comparison round, the $2^{nd}$ to the $4^{th}$ data bits (AAG) of the data read 822C are used as the seed data 822C-2 of the $2^{nd}$ comparison round; and the rest can be obtained by the same analogy. The seed data 822C-Y in the last comparison round is the last 3 data bits (ATG) of the data read 822C.

Figure 8D:
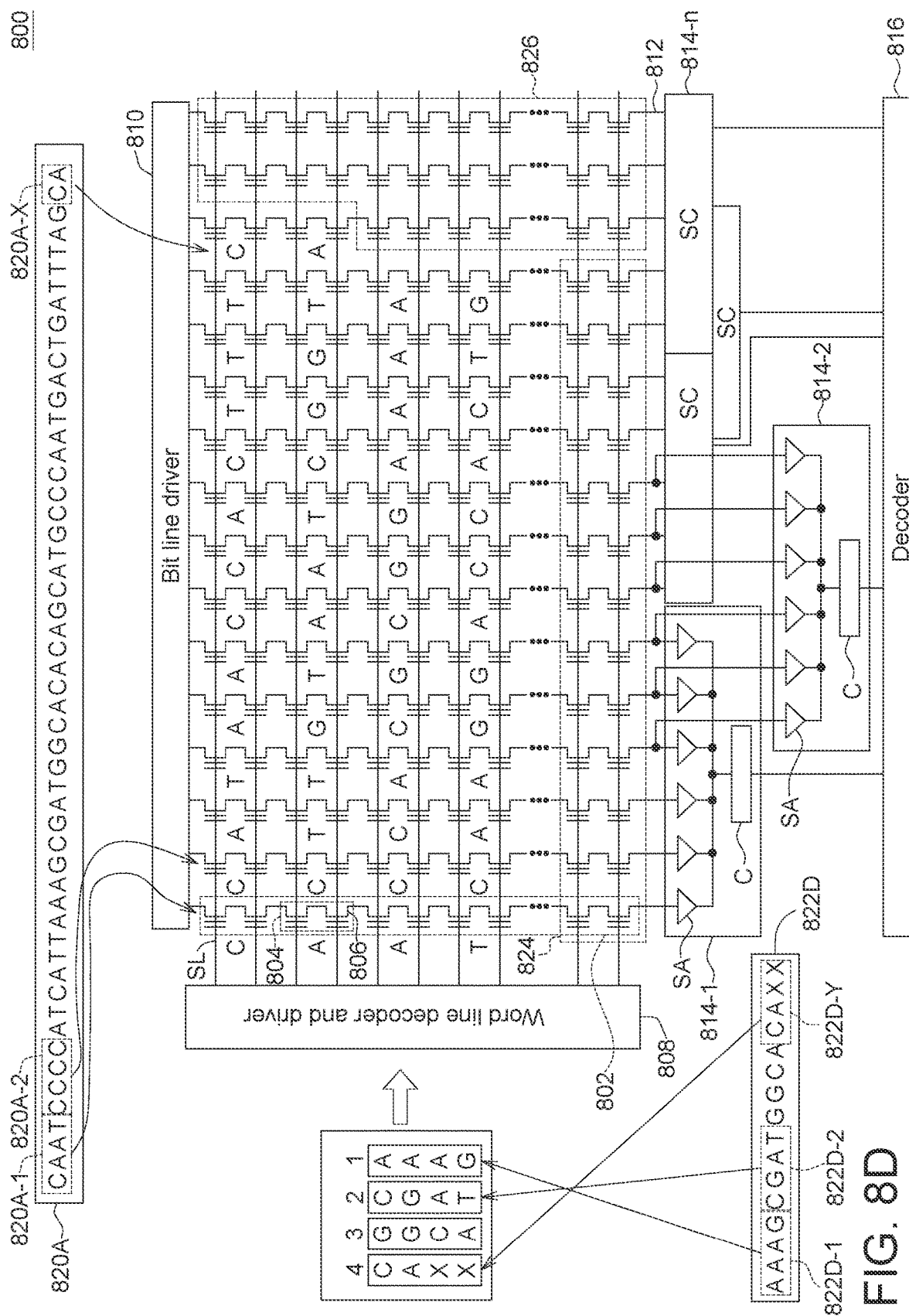
FIG. 8D is a schematic diagram of a fourth operation diagram of the CAM device according to the eighth embodiment.

Referring to FIG. 8D, a schematic diagram of a fourth operation of the CAM device 800 according to the eighth embodiment is shown. The operation of the CAM device 800 of FIG. 8D is different the CAM device 800 of FIGS. 8A, 8B, and 8C in that the CAM device 800 of FIG. 8D performs read mapping using both the fixed seed data method and the fixed reference string data method, and the details are disclosed below.

As indicated in FIG. 8D, the reference string data 820D includes a plurality of portions 820D-1~820D-X (X is a positive integer). The reference string data 820D includes but is not limited to CAATCCCCATCATTAAAGC-GATGGCACACAGCATGCCCAATGACTGATTTA GCA. The first portion 820D-1 of the reference string data 820D, which includes the $1^{st}$ to the $4^{th}$ data bits (CAAT), is stored in the first CAM cell strings 802; the second portion 820D-2 of the reference string data 820D, which includes to the $5^{th}$ to the $8^{th}$ data bits (CCCC), is stored in the $2^{nd}$ CAM cell string 802; and the rest can be obtained by the same analogy. The $X^{th}$ portion 820D-X of the reference string data 820D, which includes the last two data bits (CA), is stored in one of the CAM cell strings 802. The method which selects a portion of the reference string data is referred as fixed reference string data method.

As indicated in FIG. 8D, the data read 822D includes a plurality of data bits, including but not limited to AAAGC-GATGGCACA. The $1^{st}$ to the $4^{th}$ data bits (AAAG) of the data read 822D are used as the seed data 822D-1 in the $1^{st}$ comparison round; the $5^{th}$ to the $8^{th}$ data bits (CGAT) of the data read 822D are used as the seed data 822D-2 in the $2^{nd}$ comparison round; and the rest can be obtained by the same analogy. The method which selects seed data from the data read is referred as fixed seed data method.

The seed data 822D-Y in the last comparison round, being the last 2 data bits (CA) of the data read 822D, has a smaller quantity of data bits, therefore 2 wildcards XX are added to the seed data 822D-Y in the last comparison round, such that the quantity of data bits of the seed data 822D-Y in the last comparison round will be equivalent to the quantity of data bits of the seed data in previous comparison rounds.

In an embodiment, the longer the data read, the larger the seed data. Therefore, when the read mapping has long data read and large reference string data, the uncertainty of voting can be reduced, and the efficiency of the seed and voting strategy can be increased.

Based on the operations of FIGS. 8A-8D, it can be understood that the CAM device 800 can more correctly match the data read and the reference string data to increase the reliability of the seed and voting strategy.

In an embodiment of the present application, when data search comparison is performed using the CAM device 800 of one of FIG. 8A to FIG. 8D, if data search comparison fails (that is, the counting results of the sense counting circuits are not higher than a threshold), the CAM device 800 of another one of FIG. 8A to FIG. 8D can be used to perform data search comparison to obtain the best read mapping results. This is still within the spirit of the present application.

Figure 9:
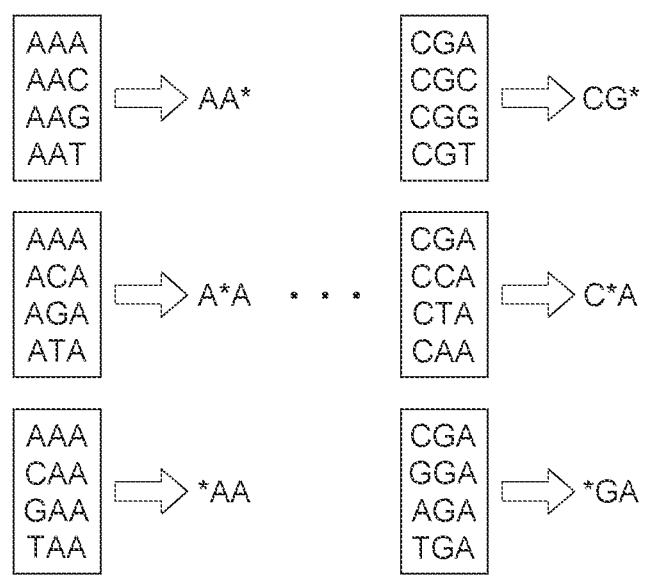
FIG. 9 is a schematic diagram of speeding data search comparison using wildcard.

Referring to FIG. 9, a schematic diagram of speeding data search comparison using wildcard is shown. As indicated in FIG. 9, the storage data AAA, AAC, AAG, AAT will all match when search is performed using "AA* (*representing wildcard)" as the search word. That is, in one round of search operation, search several data can be searched at the same time. Conversely, without using wildcard in searching the storage data are AAA, AAC, AAG, AAT, four rounds of search operation will be required for obtaining a search result. Thus, through FIG. 9, as fewer rounds are required for read mapping, data search comparison can be speeded up.

In an embodiment, when read mapping is performed on the data read and the reference string data, if the data search comparison fails after using all of FIG. 8A to FIG. 8D, the search data still can be performed using a graphics processing unit (GPU) or a central processing unit (CPU).

Figure 10:
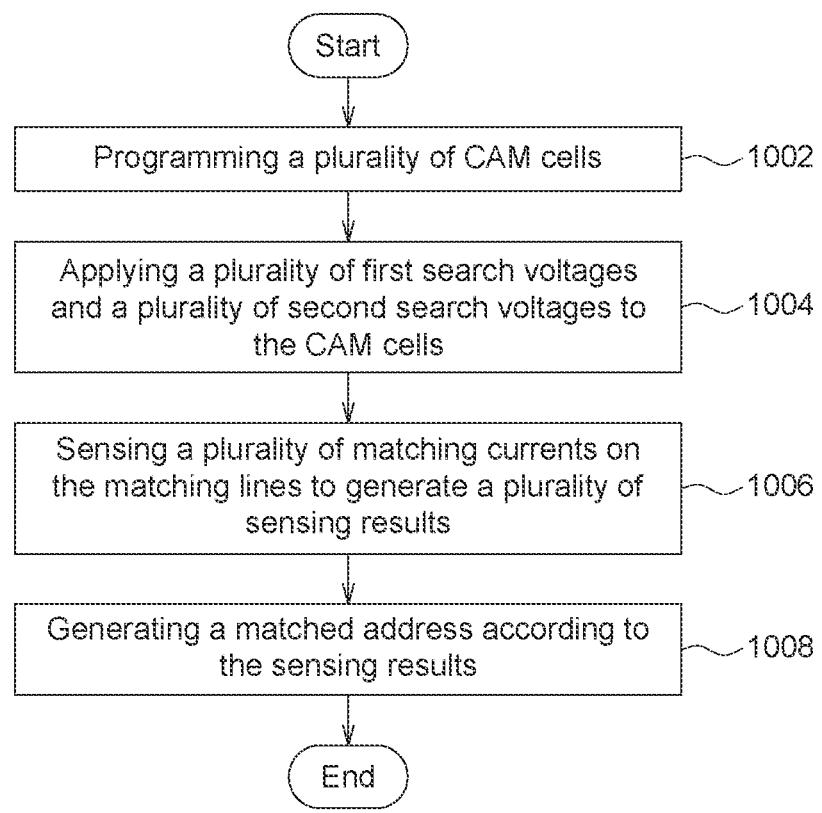
FIG. 10 is an operation method of a CAM device according to a ninth embodiment of the present application.

FIG. 10 is an operation method of a CAM device according to a ninth embodiment of the present application. The operation method includes the following steps. In step 1002, a plurality of CAM cells are programmed, wherein each of the CAM cells includes a plurality of flash memory cells, a storage data of each of the CAM cells is based on a combination of a plurality of threshold voltages of the flash memory cells of each of the CAM cells, and the CAM cells are coupled to a plurality of matching lines. In step 1004, a plurality of first search voltages and a plurality of second search voltages are applied on the CAM cells. In step 1006, a plurality of matching currents on the matching lines are sensed to generate a plurality of sensing results. In step 1008, a matched address is generated according to the sensing results, wherein the matched address indicates addresses of the CAM cells having a matched search result.

Details of steps 1002-1008 are as disclosed in above embodiments, and are not repeated here. FIG. 10 is applicable to the fifth embodiment.

Figure 11:
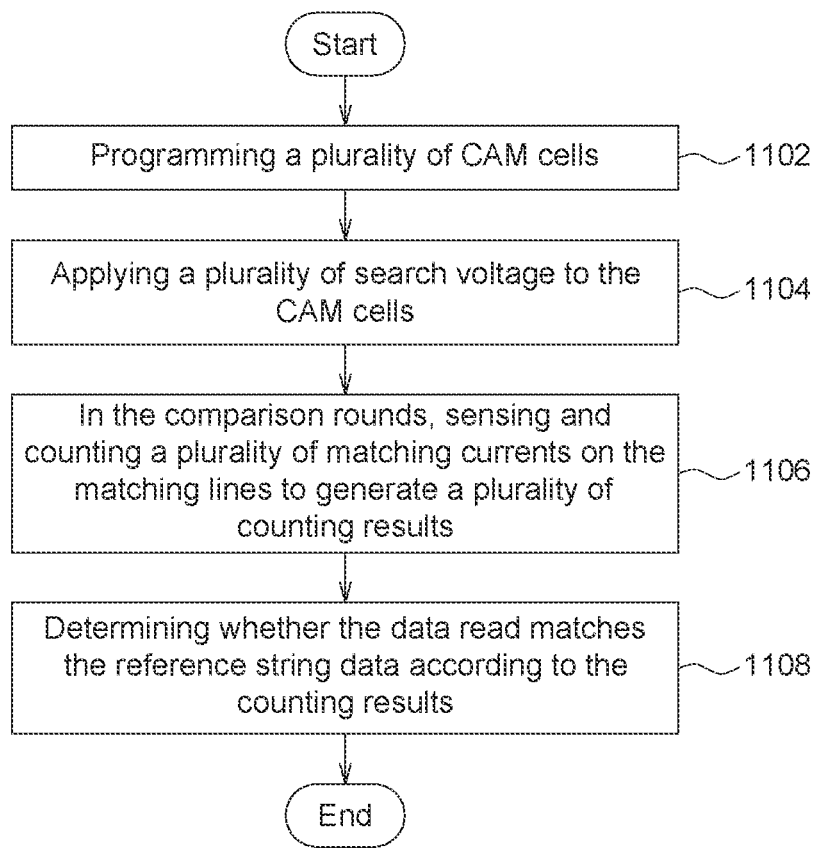
FIG. 11 is an operation method of a CAM device according to a tenth embodiment of the present application.

FIG. 11 is an operation method of a CAM device according to a tenth embodiment of the present application. The operation method of a CAM device includes the following step. In step 1102, a plurality of CAM cells are programmed, wherein each of the CAM cells includes a plurality of serial-coupled flash memory cells, individual storage data of each of the CAM cell strings is related to a portion of a reference string data, and the CAM cells are coupled to a plurality of matching lines. In step 1104, a plurality of search voltage are applied on the CAM cells, wherein in a plurality of comparison rounds, a data read is configured to determine the search voltages applied on the CAM cells. In step 1106, in the comparison rounds, a plurality of matching currents on the matching lines are sensed and counted to generate a plurality of counting results. In step 1108, whether the data read matches the reference string data is determined according to the counting results.

Details of step 1102-1108 are as disclosed in above embodiments, and are not repeated here. FIG. 11 is applicable to the eighth embodiment.

In above embodiments of the present application, the CAM cell can be realized by a multi-level CAM cell (MLC) capable of storing 2 bits, a triple-level CAM cell (TLC) capable of storing 3 bits, a quad-level CAM cell (QLC)

capable of storing 4 bits, or a penta-level CAM cell (PLC) capable of storing 5 bits, and is still within the spirit of the present application.

In above embodiments of the present application, the CAM memory device can be realized as a two-dimensional (2D) flash memory architecture or a three-dimensional (3D) flash memory architecture, and is still within the spirit of the present application.

In above embodiments of the present application, data search matching can adopt the 3D-NAND architecture, not only saving memory space, but also increasing the density of in-memory searching (IMS) as well as the matching speed and the matching accuracy.

The above embodiments of the present application are applicable to long word search deign. Therefore, when big data search is performed using the CAM cells and CAM memory device of embodiments of the present application, the IMS density can be increased.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A content addressable memory (CAM) cell, comprising:
   a first flash memory cell having a first terminal for receiving a first search voltage, the first terminal of the first flash memory cell being a gate terminal; and
   a second flash memory cell having a first terminal for receiving a second search voltage, a second terminal of the first flash memory cell electrically connected to a second terminal of the second flash memory cell, the first terminal of the second flash memory cell being a gate terminal;
   wherein the first flash memory cell and the second flash memory cell are serially connected; and a storage data of the CAM cell based on a combination of a plurality of threshold voltages of the first flash memory cell and the second flash memory cell, the first search voltage and the second search voltage are determined based a search data, and the search data is compared with the storage data,
   when the storage data is a first predetermined storage data, a first threshold voltage of the first flash memory cell is a minimum threshold voltage value and a second threshold voltage of the second flash memory cell is a maximum threshold voltage value; when the storage data is a second predetermined storage data, the first threshold voltage is the maximum threshold voltage value and the second threshold voltage is the minimum threshold voltage value; when the storage data is a third predetermined storage data, the first threshold voltage and the second threshold voltage both are the minimum threshold voltage value; and when the storage data is a fourth predetermined storage data, the first threshold voltage and the second threshold voltage both are greater than or equivalent to the maximum threshold voltage value.

2. A content addressable memory (CAM) device, comprising:
   a plurality of first CAM cell strings, wherein the first CAM cell strings comprise a plurality of first CAM cells, each of the first CAM cells comprises a plurality of flash memory cells and a storage data of each of the first CAM cells is based on a combination of a plurality of threshold voltages of the flash memory cells of each of the first CAM cells;
   a first word line driver configured to provide a plurality of first search voltages and a plurality of second search voltages to the first CAM cells;
   a plurality of first matching lines coupled to the first CAM cells;
   a plurality of first sense amplifiers coupled to the first matching line; and
   a decoder coupled to the first sense amplifiers;
   wherein
   when the first search voltages and the second search voltages are applied on the first CAM cells, the first sense amplifiers sense a plurality of first matching currents on the first matching lines to generate a plurality of first sensing results; and
   the decoder generates a first matched address according to the first sensing results, wherein the first matched address indicates addresses of matched first CAM cells having a matched first search result,
   in each of the first CAM cell, a first flash memory cell having a first terminal for receiving a first one among the plurality of first search voltages, the first terminal of the first flash memory cell being a gate terminal; and a second flash memory cell having a first terminal for receiving a first one among the plurality of second search voltages, a second terminal of the first flash memory cell electrically connected to a second terminal of the second flash memory cell, the first terminal of the second flash memory cell being a gate terminal, the first flash memory cell and the second flash memory cell are serially connected, the first one among the plurality of first search voltages and the first one among the plurality of second search voltages are determined based on a search data, and the search data is compared with the storage data,
   when the storage data is a first predetermined storage data, a first threshold voltage of a first flash memory cell of each of the flash memory cells is a minimum threshold voltage value and a second threshold voltage of a second flash memory cell of each of the flash memory cells is a maximum threshold voltage value; when the storage data is a second predetermined storage data, the first threshold voltage is the maximum threshold voltage value and the second threshold voltage is the minimum threshold voltage value; when the storage data is a third predetermined storage data, the first threshold voltage and the second threshold voltage both are the minimum threshold voltage value; and when the storage data is a fourth predetermined storage data, the first threshold voltage and the second threshold voltage both are greater than or equivalent to the maximum threshold voltage value.

3. The CAM device according to claim 2, wherein in the first CAM cell,
   when a search data is a first predetermined search data, the first search voltage is a minimum search voltage value and the second search voltage is a maximum search voltage value; when the search data is a second predetermined search data, the first search voltage is the maximum search voltage value and the second search voltage is the minimum search voltage value; and when the search data is a third predetermined search data, the first search voltage and the second search voltage both are the maximum search voltage value;

wherein when the first matching current appears on the first matching line, the first search result is "match".

4. The CAM device according to claim 2, wherein the CAM device further comprises:
a plurality of second CAM cell strings, wherein the second CAM cell strings comprise a plurality of second CAM cells, each of the second CAM cells comprises a plurality of flash memory cells and a storage data of each of the second CAM cells is based on a combination of a plurality of threshold voltages of the flash memory cells of each of the second CAM cells;
a second word line driver configured to provide a plurality of third search voltages and a plurality of fourth search voltages to the second CAM cells;
a plurality of second matching lines coupled to the second CAM cells;
a plurality of second sense amplifiers coupled to the second matching lines; and
wherein
when the third search voltages and the fourth search voltages are applied on the second CAM cells, the second sense amplifiers sense a plurality of second matching currents on the second matching lines to generate a plurality of the second sensing result;
wherein
the decoder generates the first matched address and a second matched address according to a plurality of results of logic operations of the first and second sensing results, wherein the second matched address indicates addresses of the second CAM cells having a matched second search result.

5. The CAM device according to claim 4, further comprising:
a plurality of logic gates coupled between the first sense amplifiers and the decoder or coupled between the second sense amplifiers and the decoder.

6. An operation method of a CAM device, comprising:
programming a plurality of CAM cells, wherein each of the CAM cells comprises a plurality of flash memory cells, a storage data of each of the CAM cells is based on a combination of a plurality of threshold voltages of the flash memory cells of each of the CAM cells, and the CAM cells are coupled to a plurality of matching lines;
applying a plurality of first search voltages and a plurality of second search voltages on the CAM cells;
sensing a plurality of matching currents on the matching lines to generate a plurality of sensing results; and
generating a matched address according to the sensing results, wherein the matched address indicates that a search result is individual addresses of matched CAM cells,
in each of the first CAM cell, a first flash memory cell having a first terminal for receiving a first one among the plurality of first search voltages, the first terminal of the first flash memory cell being a gate terminal; and a second flash memory cell having a first terminal for receiving a first one among the plurality of second search voltages, a second terminal of the first flash memory cell electrically connected to a second terminal of the second flash memory cell, the first terminal of the second flash memory cell being a gate terminal, the first flash memory cell and the second flash memory cell are serially connected, the first one among the plurality of first search voltages and the first one among the plurality of second search voltages are determined based on a search data, and the search data is compared with the storage data,
when the storage data is a first predetermined storage data, a first threshold voltage of a first flash memory cell of each of the flash memory cells is a minimum threshold voltage value and a second threshold voltage of a second flash memory cell each of the flash memory cells is a maximum threshold voltage value; when the storage data is a second predetermined storage data, the first threshold voltage is the maximum threshold voltage value and the second threshold voltage is the minimum threshold voltage value; when the storage data is a third predetermined storage data, the first threshold voltage and the second threshold voltage both are the minimum threshold voltage value; and when the storage data is a fourth predetermined storage data, the first threshold voltage and the second threshold voltage both are the maximum threshold voltage value.

7. The operation method according to claim 6, wherein in the CAM cell,
when a search data is a first predetermined search data, the first search voltage is a minimum search voltage value and the second search voltage is a maximum search voltage value;
when the search data is a second predetermined search data, the first search voltage is the maximum search voltage value and the second search voltage is the minimum search voltage value; when the search data is a third predetermined search data, the first search voltage and the second search voltage both are the maximum search voltage value;
wherein when the matching current appears on the matching line, the search result is "match".

* * * * *